US009240507B2

(12) United States Patent
Yoshikawa et al.

(10) Patent No.: US 9,240,507 B2
(45) Date of Patent: Jan. 19, 2016

(54) INTERMEDIATE BAND SOLAR CELL USING TYPE I AND TYPE II QUANTUM DOT SUPERLATTICES

(71) Applicant: Sharp Kabushiki Kaisha, Osaka-shi, Osaka (JP)

(72) Inventors: Hirofumi Yoshikawa, Osaka (JP); Makoto Izumi, Osaka (JP); Yasutaka Kuzumoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/589,184

(22) Filed: Jan. 5, 2015

(65) Prior Publication Data
US 2015/0214402 A1 Jul. 30, 2015

(30) Foreign Application Priority Data

Jan. 28, 2014 (JP) .................................. 2014-013218
Jan. 28, 2014 (JP) .................................. 2014-013219

(51) Int. Cl.
H01L 31/0352 (2006.01)
B82Y 30/00 (2011.01)

(52) U.S. Cl.
CPC *H01L 31/035218* (2013.01); *H01L 31/035236* (2013.01); *B82Y 30/00* (2013.01); *Y10S 977/774* (2013.01); *Y10S 977/948* (2013.01)

(58) Field of Classification Search
None
See application file for complete search history.

(56) References Cited

U.S. PATENT DOCUMENTS

| 6,566,595 | B2 * | 5/2003 | Suzuki ........................... 136/255 |
| 8,895,840 | B2 * | 11/2014 | Suto ............................... 136/255 |
| 2007/0151592 | A1 | 7/2007 | Forrest et al. | |
| 2009/0095349 | A1 * | 4/2009 | Forrest et al. ................. 136/262 |
| 2011/0290310 | A1 * | 12/2011 | Kuramachi et al. ........... 136/255 |
| 2012/0160312 | A1 * | 6/2012 | Arakawa et al. ............... 136/255 |

(Continued)

FOREIGN PATENT DOCUMENTS

JP 2006-114815 A 4/2006
JP 2010-509772 A 3/2010

OTHER PUBLICATIONS

Hwang, Jinyoung. Engineered Type-II Heterostructures for High Eficiency Solar Cells. Diss. Unviversity of Michigan, 2013. Ann Arbor: University of Michigan, Dept. of Electrical Engineering, 2013.*

(Continued)

*Primary Examiner* — Joseph Schoenholtz
(74) *Attorney, Agent, or Firm* — Keating & Bennett, LLP

(57) ABSTRACT

A light receiving element includes a p-type semiconductor layer, an n-type semiconductor layer, and a first and a second superlattice semiconductor layers, and the first and the second superlattice semiconductor layers each have a superlattice structure in which a barrier layer and a quantum dot layer are alternately and repeatedly stacked. A band structure of the superlattice structure of the first superlattice semiconductor layer is a type I structure, and that of the second superlattice semiconductor layer is a type II structure. The superlattice structures of the first and the second superlattice semiconductor layers each form a superlattice miniband, and a conduction band first superlattice miniband of the superlattice structure of the second superlattice semiconductor layer is lower in lower and energy than a conduction band first superlattice miniband of the superlattice structure of the first superlattice semiconductor layer.

10 Claims, 20 Drawing Sheets

(56) References Cited

U.S. PATENT DOCUMENTS

2014/0224328 A1* 8/2014 Afanasev et al. ............ 136/262
2014/0326302 A1* 11/2014 Arakawa et al. ............ 136/255

OTHER PUBLICATIONS

Shoji, Yasushi; Akimoto, Katsuhrio; Okada, Yoshitaka, "InGaAs/GaAsSb type-II quantum dots for intermediate band solar cell," Photovoltaic Specialists Conference (PVSC), vol. 2, 2012 IEEE 38th, vol., No., pp. 1,4, Jun. 3-8, 2012.*

Marti et al., "Production of Photocurrent due to Intermediate-to-Conduction-Band Transitions: A Demonstration of a Key Operating Principle of the Intermediate-Band Solar Cell", Physical Review Letters, vol. 97, Dec. 15, 2006, pp. 247701-1 to 247701-4.

Tomic, "Intermediate-band solar cells: Influence of band formation on dynamical processes in InAs/GaAs quantum dot arrays", Physical Review B, vol. 82, 2010, pp. 195321-1 to 195321-15.

Chang et al., "Carrier dynamics of type-II InAs/GaAs quantum dots covered by a thin $GaAs_{1x}Sb_x$ layer", Applied Physics Letters, vol. 93, 2008, pp. 033107-1 to 033107-3.

* cited by examiner (a)

(b)

US 9,240,507 B2

INTERMEDIATE BAND SOLAR CELL USING TYPE I AND TYPE II QUANTUM DOT SUPERLATTICES

This nonprovisional application is based on Japanese Patent Applications Nos. 2014-013218 and 2014-013219 filed on Jan. 28, 2014 with the Japan Patent Office, the entire contents of which are hereby incorporated by reference.

BACKGROUND OF THE INVENTION

1. Field of the Invention

The present invention relates to a light receiving element and a solar cell including the light receiving element, and suitably to a light receiving element including a quantum dot layer and a solar cell including the light receiving element.

2. Description of the Background Art

Various researches and developments of solar cells representing one example of devices including light receiving elements have been carried out for the purpose of enhancement of photoelectric conversion efficiency by making use of light of a wider wavelength range. For example, a solar cell in which a superlattice miniband is formed between a valence band and a conduction band of a base material by making use of quantum dot technology and electrons are photoexcited in two steps with the superlattice miniband being interposed, so that light of a long wavelength can be made use of has been proposed (for example, Japanese Patent Laying-Open No. 2006-114815, Japanese National Patent Publication No. 2010-509772, PHYSICAL REVIEW LETTERS, Vol. 97, page 247701, 2006, or PHYSICAL REVIEW B, Vol. 82, page 195321, 2010).

Such a solar cell containing quantum dots has a quantum dot layer inserted, which contains quantum dots in a base semiconductor forming an i-type semiconductor layer of a compound solar cell. By inserting a quantum dot layer in a base semiconductor, electronic bond between quantum dot layers is formed and hence a superlattice miniband is formed. With two-step photoexcitation through the superlattice miniband, light in a wavelength region which has not been made use of can be absorbed (absorption of photons lower in energy than a band gap of a base semiconductor material) so that a photocurrent can be increased. Carriers generated in quantum dots migrate through the superlattice miniband and are extracted to the outside by photoexcitation. Carriers absorbing light of a long wavelength and excited to a quantum level of a quantum structure, however, are recombined before they are extracted to an electrode.

Then, extension of a lifetime of carriers by obtaining a band structure of a quantum structure of a type II structure has been studied (Japanese Patent Laying-Open No. 2006-114815 and APPLIED PHYSICS LETTERS, Vol. 93, page 033107, 2008). By obtaining the band structure of the type II structure, generated electrons and holes are spatially separated and thus a lifetime of carriers can be extended. For example, it has been known that the type II structure can be obtained by employing InAs for quantum dots and employing $GaAs_{1-x}Sb_x$ for a barrier layer, and spatial separation of carriers is enhanced and a lifetime of carriers tends to extend by increasing a ratio of x.

SUMMARY OF THE INVENTION

Currently, a solar cell having a quantum dot layer inserted is extremely low in efficiency in extraction of carriers generated in the quantum dot layer in the solar cell, and growth of photoelectric conversion efficiency has stagnated.

The present invention was made in view of such circumstances, and a first object thereof is to provide a light receiving element allowing fabrication of a device (such as a solar cell) excellent in efficiency in extraction of carriers. A second object of the present invention is to provide a light receiving element allowing fabrication of a device (such as a solar cell) longer in a lifetime of carriers and excellent in efficiency in extraction of carriers.

The present invention is directed to a light receiving element, including a p-type semiconductor layer, an n-type semiconductor layer, and a first superlattice semiconductor layer and a second superlattice semiconductor layer arranged between the p-type semiconductor layer and the n-type semiconductor layer, the first superlattice semiconductor layer and the second superlattice semiconductor layer each have a superlattice structure in which a barrier layer and a quantum dot layer containing quantum dots are alternately and repeatedly stacked, a band structure of the superlattice structure of the first superlattice semiconductor layer is a type I structure, a band structure of the superlattice structure of the second superlattice semiconductor layer is a type II structure, the superlattice structure of the first superlattice semiconductor layer and the superlattice structure of the second superlattice semiconductor layer each form a superlattice miniband owing to a conduction band quantum level of the quantum dot layer forming the superlattice structure, and a conduction band first superlattice miniband of the superlattice structure of the second superlattice semiconductor layer is lower in lower end energy than a conduction band first superlattice miniband of the superlattice structure of the first superlattice semiconductor layer.

In the light receiving element according to the present invention, preferably, the second superlattice semiconductor layer is arranged on a side of the n-type semiconductor layer.

In the light receiving element according to the present invention, preferably, the superlattice miniband formed in the superlattice structure of the first superlattice semiconductor layer overlaps at least in part with the superlattice miniband formed in the superlattice structure of the second superlattice semiconductor layer, or magnitude of energy gap between the superlattice miniband formed in the superlattice structure of the first superlattice semiconductor layer and the superlattice miniband formed in the superlattice structure of the second superlattice semiconductor layer is equal to or smaller than a total sum of LO phonon energy of a material for the barrier layer of the first superlattice semiconductor layer and thermal energy kT (k representing a Boltzmann constant and T representing an absolute temperature) at room temperature.

In the light receiving element according to the present invention, preferably, the first superlattice semiconductor layer is composed of Ga, In, and As, and the second superlattice semiconductor layer is composed of Ga, In, As, and Sb.

In the light receiving element according to the present invention, preferably, the p-type semiconductor layer, the first superlattice semiconductor layer, the second superlattice semiconductor layer, and the n-type semiconductor layer are stacked in this order on a substrate composed of GaAs.

A solar cell according to the present invention includes the light receiving element according to the present invention.

The present invention is directed to a light receiving element, including a superlattice semiconductor layer having a superlattice structure in which a barrier layer and a quantum dot layer containing quantum dots are alternately and repeatedly stacked, the barrier layer contains at least any of Ga and Al, As, and Sb, the quantum dot layer contains In and As, and a value q represented by a composition ratio of the barrier layer Sb/(Sb+As) and a distance d (nm) between the quantum dots in a direction of stack of the superlattice semiconductor layer satisfy relation of $q \geq (3d+10)/100$.

In the light receiving element according to the present invention, preferably, value q represented by the composition ratio of the barrier layer Sb/(Sb+As) and distance d (nm) between the quantum dots in the direction of stack of the superlattice semiconductor layer satisfy relation of $q \geq (3d+15)/100$.

The light receiving element according to the present invention preferably further includes a p-type semiconductor layer and an n-type semiconductor layer, and the superlattice structure lying between the p-type semiconductor layer and the n-type semiconductor layer.

A solar cell according to the present invention includes the light receiving element according to the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
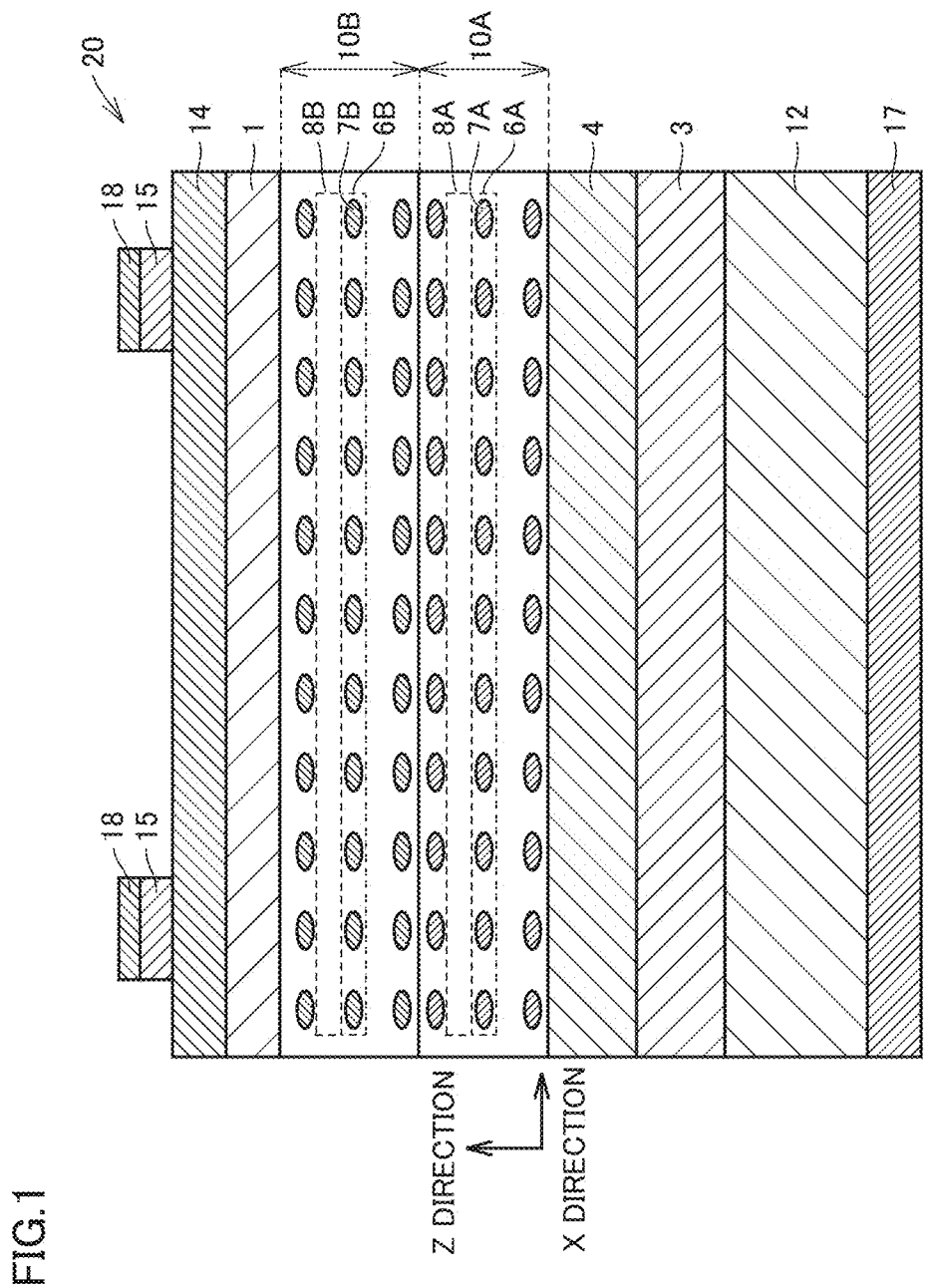
FIG. 1 is a schematic cross-sectional view showing a construction of a solar cell including a light receiving element according to a first embodiment of the present invention.

A light receiving element and a solar cell according to the present invention will be described hereinafter in detail with reference to the drawings. In the drawings of the present invention, the same or corresponding elements have the same reference characters allotted. Relation of a dimension such as length, width, thickness, and depth is modified as appropriate for clarity and simplification of the drawings, and actual dimensional relation is not shown.

Terms used herein will briefly be explained here.

A "superlattice semiconductor layer" has a superlattice structure constituted of a barrier layer and a quantum dot layer which are repeatedly stacked a plurality of times. The barrier layer and the quantum dot layer are both made of a compound semiconductor material. The barrier layer is higher in band gap energy than the quantum dot layer.

A "superlattice structure" means being constituted of crystal lattices longer in a periodic structure than a basic unit lattice as a result of layering of a plurality of types of crystal lattices.

A "quantum dot" refers to a semiconductor fine particle having a particle size not greater than 100 nm, which is a fine particle surrounded by a semiconductor material greater in band gap than a semiconductor material forming the quantum dot.

A "quantum dot layer" refers to a layer containing quantum dots and a base semiconductor material greater in band gap than a semiconductor material forming the quantum dots.

A "barrier layer" refers to a layer made of a base semiconductor material greater in band gap than a semiconductor material forming quantum dots and not containing the quantum dots.

A "type I structure" refers to a structure in which different semiconductor materials are alternately stacked, which is a band structure in which a conduction band and a valence band made of a material smaller in band gap lie between a conduction band and a valence band of a material greater in band gap. Consequently, electrons and holes are confined on a side of a material smaller in band gap and efficiency in absorption and light emission is high.

A "type II structure" refers to a structure in which different semiconductor materials are alternately stacked, which is a band structure in which an amount of discontinuity of a band is different in sign between a valence band and a conduction band. Consequently, electrons and holes are confined on sides of different materials, respectively, and spatially separated. Though efficiency in absorption and light emission is lower than that of the type I structure, a lifetime of carriers is extended.

A "superlattice miniband" refers to a band which is formed as wave functions which have penetrated from quantum dots overlap with each other and discrete energy level of each quantum dot forms a flux. At least a part of the superlattice miniband is formed between an upper end of a valence band and a lower end of a conduction band of a barrier layer.

A "quantum level" refers to a discrete energy level of electrons.

A "conduction band first superlattice miniband" means a superlattice miniband formed by a ground level on a side of a conduction band of a superlattice structure.

"Lower end energy of a conduction band first superlattice miniband" means minimum energy of a conduction band first superlattice miniband.

A "conduction band second or higher superlattice miniband" means a superlattice miniband formed by an excitation level on a side of a conduction band of a superlattice structure.

<<First Embodiment>>

[Construction of Light Receiving Element]

FIG. 1 is a schematic cross-sectional view showing a construction of a solar cell including a light receiving element according to a first embodiment of the present invention. The light receiving element according to the present embodiment includes an n-type semiconductor layer 1, a p-type semiconductor layer 4, and a first superlattice semiconductor layer 10A and a second superlattice semiconductor layer 10B (hereinafter also denoted as a "superlattice semiconductor layer" as a concept encompassing both of them) arranged between n-type semiconductor layer 1 and p-type semiconductor layer 4.

<N-Type Semiconductor Layer>

N-type semiconductor layer 1 is made of a semiconductor containing an n-type impurity.

In the first embodiment, in a solar cell 20, n-type semiconductor layer 1 is located on a light incident side of first superlattice semiconductor layer 10A and second superlattice semiconductor layer 10B, however, n-type semiconductor layer 1 can also be located opposite to the light incident side of first superlattice semiconductor layer 10A and second superlattice semiconductor layer 10B.

N-type semiconductor layer 1 can form a pin junction or a pn junction (including a pn–n junction, a pp–-n junction, a p+pn junction, and a pnn+ junction) together with first superlattice semiconductor layer 10A, second superlattice semiconductor layer 10B, and p-type semiconductor layer 4. Electromotive force is generated by light reception by the pin junction or the pn junction.

The n-type semiconductor layer is preferably formed from a thin film formed with CVD or MBE.

The n-type semiconductor layer may be a layer obtained by adding an n-type impurity to a semiconductor material the same as that for a barrier layer 8A or 8B or a layer obtained by adding an n-type impurity to a semiconductor material different from that for barrier layer 8A or 8B.

The n-type semiconductor layer is preferably composed of n-GaAsSb, n-GaAs, n-AlGaAs, n-AlGaAsSb, n-AlAsSb, n-InAlAs, or n-ZnTe.

A concentration of an n-type impurity in the n-type semiconductor layer is not particularly limited, and it is preferably set as appropriate depending on a semiconductor material forming the n-type semiconductor layer.

A thickness of the n-type semiconductor layer is not particularly limited, and it is preferably set as appropriate such that light can sufficiently be absorbed by the superlattice semiconductor layer.

<P-Type Semiconductor Layer>

P-type semiconductor layer 4 is made of a semiconductor containing a p-type impurity.

In the first embodiment, in solar cell 20, p-type semiconductor layer 4 is located opposite to the light incident side of first superlattice semiconductor layer 10A and second superlattice semiconductor layer 10B, however, p-type semiconductor layer 4 can also be located on the light incident side of first superlattice semiconductor layer 10A and second superlattice semiconductor layer 10B.

P-type semiconductor layer 4 can form a pin junction or a pn junction (including a pn–n junction, a pp–n junction, a p+pn junction, and a pnn+ junction) together with first superlattice semiconductor layer 10A, second superlattice semiconductor layer 10B, and n-type semiconductor layer 1. Electromotive force is generated by light reception by the pin junction or the pn junction.

The p-type semiconductor layer may be formed from a thin film formed with CVD or MBE.

The p-type semiconductor layer may be a layer obtained by adding a p-type impurity to a semiconductor material the same as that for barrier layer 8A or 8B or a layer obtained by adding a p-type impurity to a semiconductor material different from that for barrier layer 8A or 8B.

The p-type semiconductor layer is preferably composed of p-GaAs, p-GaAsSb, p-AlGaAs, p-AlGaAsSb, p-AlAsSb, p-InAlAs, or p-ZnTe.

A concentration of a p-type impurity in the p-type semiconductor layer is not particularly limited, and it is preferably set as appropriate depending on a semiconductor material forming the p-type semiconductor layer.

A thickness of the p-type semiconductor layer is not particularly limited, and it is preferably set as appropriate such that light can sufficiently be absorbed by the superlattice semiconductor layer.

<First Superlattice Semiconductor Layer and Second Superlattice Semiconductor Layer>

First superlattice semiconductor layer 10A and second superlattice semiconductor layer 10B are arranged between n-type semiconductor layer 1 and p-type semiconductor layer 4.

First superlattice semiconductor layer 10A has a superlattice structure in which barrier layer 8A and a quantum dot layer 6A are alternately and repeatedly stacked. In quantum dot layer 6A, a plurality of quantum dots 7A are arranged in a semiconductor material the same as that for barrier layer 8A. A band structure of the superlattice structure of the first superlattice semiconductor layer is the type I structure.

Second superlattice semiconductor layer 10B has a superlattice structure in which barrier layer 8B and a quantum dot layer 6B are alternately and repeatedly stacked. In quantum dot layer 6B, a plurality of quantum dots 7B are arranged in a semiconductor material the same as that for barrier layer 8B. A band structure of the superlattice structure of the second superlattice semiconductor layer is the type II structure.

Though not shown in FIG. 1, in the superlattice semiconductor layer, an insertion layer such as a cap layer or a quantum well different in material from the quantum dot layer and the barrier layer may repeatedly be stacked together with the quantum dot layer and the barrier layer.

In the following, a concept encompassing quantum dot layer 6A and quantum dot layer 6B, a concept encompassing quantum dots 7A and quantum dots 7B, and a concept encompassing barrier layer 8A and barrier layer 8B are also denoted as a "quantum dot layer," a "quantum dot", and a "barrier layer", respectively.

Though each material for the quantum dots and the barrier layer is not particularly limited, preferably a group III-V compound semiconductor is employed. The quantum dots are preferably made of a semiconductor material lower in band gap energy than the barrier layer. For example, each material for the quantum dots and the barrier layer is preferably $GaAs_xSb_{1-x}$, $AlSb$, $InAs_xSb_{1-x}$, $Ga_xIn_{1-x}Sb$, $AlSb_xAs_{1-x}$, $AlAs_zSb_{1-z}$, $In_xGa_{1-x}As$, $Al_xGa_{1-x}As$, $Al_yGa_{1-y}As_zSb_{1-z}$, $In_xGa_{1-x}P$, $(Al_yGa_{1-y})_zIn_{1-z}P$, $GaAs_xP_{1-x}$, $Ga_yIn_{1-y}As_zP_{1-z}$, and $In_xAl_{1-x}As$ (in all of which materials a condition of $0 \leq x \leq 1$, $0 \leq y \leq 1$, and $0 \leq z \leq 1$ is satisfied, which is also the case hereinafter), and may be a mixed crystal material thereof.

Each material for the quantum dots and the barrier layer may be a group IV semiconductor in the periodic table, a compound semiconductor made of a group III semiconductor material and a group V semiconductor material, or a compound semiconductor made of a group II semiconductor material and a group VI semiconductor material, or may be a mixed crystal material thereof. Alternatively, each material for the quantum dots and the barrier layer may be a chalcopyrite-based material or a semiconductor other than the chalcopyrite-based material.

For example, combination of a material for the barrier layer and a material for the quantum dots (hereinafter, A and B in A/B representing a material for the quantum dots and a material for the barrier layer, respectively) is exemplified by $In_xGa_{1-x}As/GaAs$, $In_xGa_{1-x}As/GaNAs$, $In_xGa_{1-x}As/Al_xGa_{1-x}As$, $In_xGa_{1-x}As/In_xGa_{1-x}P$, $In_xGa_{1-x}As/Ga_yIn_{1-y}As_zP_{1-z}$, $Ga_xIn_{1-x}N/GaN$, $In_xGa_{1-x}As/Al_yGa_{1-y}As_zSb_{1-z}$, $In_xGa_{1-x}As/GaAs_xSb_{1-x}$, $In_xGa_{1-x}As/AlAs_zSb_{1-z}$, $In_xGa_{1-x}As/Al_xGa_{1-x}Sb$, $InAs_xSb_{1-x}/GaAs_xSb_{1-x}$, $InAs_xSb_{1-x}/Al_yGa_{1-y}As_zSb_{1-z}$, $InAs_xSb_{1-x}/$ $AlAs_zSb_{1-z}$, $InAs_xSb_{1-x}/Al_xGa_{1-x}Sb$, $InP/In_xAl_{1-x}As$, $In_xGa_{1-x}As/In_xAl_{1-x}As$, $In_xGa_{1-x}As/GaAs_xP_{1-x}$, $In_xGa_{1-x}As/(Al_yGa_{1-y})_zIn_{1-z}P$, $InAs_xSb_{1-x}/In_xGa_{1-x}P$, $InAs_xSb_{1-x}/GaAs_xP_{1-x}$, $Ga_xIn_{1-x}Sb/AlSb$, $CuInSe_2/CuGaS_2$, and $ZnSe/ZnTe$ (in all of which materials a condition of $0 \leq x \leq 1$, $0 \leq y \leq 1$, and $0 \leq z \leq 1$ is satisfied).

Among these combinations, in order to obtain the type I structure, $In_xGa_{1-x}As/GaAs$, $In_xGa_{1-x}As/GaNAs$, $In_xGa_{1-x}As/Al_xGa_{1-x}As$, $In_xGa_{1-x}As/In_xGa_{1-x}P$, $In_xGa_{1-x}As/Ga_yIn_{1-y}As_zP_{1-z}$, $Ga_xIn_{1-x}N/GaN$, $In_xGa_{1-x}As/In_xAl_{1-x}As$, $In_xGa_{1-x}As/GaAs_xP_{1-x}$, $In_xGa_{1-x}As/(Al_yGa_{1-y})_zIn_{1-z}P$, $InAs_xSb_{1-x}/In_xGa_{1-x}P$, $InAs_xSb_{1-x}/GaAs_xP_{1-x}$, $Ga_xIn_{1-x}Sb/AlSb$, or $CuInSe_2/CuGaS_2$ is preferably employed.

In order to obtain the type II structure, $In_xGa_{1-x}As/GaAs_xSb_{1-x}$, $In_x$, $Ga_{1-x}As/Al_yGa_{1-y}As_zSb_{1-z}$, $In_xGa_{1-x}As/AlAs_zSb_{1-z}$, $In_xGa_{1-x}As/Al_yGa_{1-x}Sb$, $InAs_xSb_{1-x}/GaAs_xSb_{1-x}$, $InAs_xSb_{1-x}/Al_yGa_{1-y}As_zSb_{1-z}$, $InAs_xSb_{1-x}/AlAs_zSb_{1-z}$, $InAs_xSb_{1-x}/Al_yGa_{1-x}Sb$, $InP/In_xAl_{1-x}As$, or $ZnSe/ZnTe$ is preferably employed.

Preferably, the first superlattice semiconductor layer is composed of Ga, In, and As, and the second superlattice semiconductor layer is composed of Ga, In, As, and Sb. The superlattice semiconductor layer can thus readily be fabricated.

The superlattice semiconductor layer further includes a substrate composed of GaAs, and the p-type semiconductor layer, the first superlattice semiconductor layer, the second superlattice semiconductor layer, and the n-type semiconductor layer are preferably stacked in this order on the substrate. The superlattice semiconductor layer can thus readily be fabricated.

The superlattice semiconductor layer may be formed from an i-type semiconductor layer or from a semiconductor layer containing a p-type impurity or an n-type impurity so long as electromotive force is generated by light reception.

In the superlattice semiconductor layer in the present embodiment, by adjusting a shape of the quantum dot, a material for the quantum dot, a thickness of the barrier layer, and a material for the barrier layer, wave functions which have penetrated from the quantum dots overlap with each other. As a result of this electronic bond, a discrete energy level for each quantum dot forms a flux and the superlattice miniband is formed in a direction of stack of the quantum dot layer.

The superlattice miniband in the present embodiment is formed by a conduction band quantum level of the quantum dot layer.

Magnitude of lower end energy of a conduction band first superlattice miniband is determined by a shape of the quantum dot, a thickness of the barrier layer, an effective mass of the quantum dot, an effective mass of the barrier layer, or an amount of discontinuity of a band between the quantum dot and the barrier layer.

Specifically, by reducing a size of the quantum dots in the direction of stack of the quantum dot layer, a size of the quantum dots in an in-plane direction of the quantum dot layer, or a size of the quantum dots in the direction of stack and the in-plane direction of the quantum dot layer, lower end energy of the superlattice miniband can be increased. For example, in the first superlattice semiconductor layer, preferably, a size of the quantum dots in the direction of stack of the quantum dot layer is from 0.5 to 50 nm and a size of the quantum dots in the in-plane direction of the quantum dot layer is from 0.5 to 100 nm. In the second superlattice semiconductor layer, preferably, a size of the quantum dots in the direction of stack of the quantum dot layer is from 0.5 to 50 nm and a size of the quantum dots in the in-plane direction of the quantum dot layer is from 0.5 to 100 nm.

By decreasing an effective mass of the quantum dots or an effective mass of the barrier layer as well, lower end energy of the superlattice miniband can be increased.

By increasing an amount of discontinuity of the band between the quantum dot and the barrier layer, lower end energy of the superlattice miniband can be increased.

By decreasing a thickness of the barrier layer, a width of energy of the superlattice miniband can be increased and lower end energy of the superlattice miniband can be decreased. For example, in the first superlattice semiconductor layer, preferably, the barrier layer has a thickness from 0.5 to 20 nm, and in the second superlattice semiconductor layer, preferably, the barrier layer has a thickness from 0.5 to 20 nm.

By thus adjusting a shape of the quantum dot, a material for the quantum dot, a thickness of the barrier layer, and a material for the barrier layer, magnitude of lower end energy of the conduction band first superlattice miniband can be controlled. The "shape of the quantum dot" includes also a size of the quantum dots. Therefore, "adjustment of a shape of the quantum dot" includes also change only in size of quantum dots 7 without change in an outer shape of the quantum dots.

In the present embodiment, the band structure of the superlattice structure of the first superlattice semiconductor layer is the type I structure, the band structure of the superlattice structure of the second superlattice semiconductor layer is the type II structure, and the conduction band first superlattice miniband of the superlattice structure of the second superlattice semiconductor layer is lower in lower end energy than the conduction band first superlattice miniband of the first superlattice semiconductor layer. Therefore, in the light receiving element according to the present embodiment, carriers photoexcited in the conduction band first superlattice miniband of the superlattice structure of the first superlattice semiconductor layer are relaxed to the conduction band first superlattice miniband of the superlattice structure of the second superlattice semiconductor layer, and electrons and holes can spatially be separated. Furthermore, since the superlattice structure of the second superlattice semiconductor layer is the type II structure, a lifetime of carriers can be extended and probability of second-step photoexcitation can be increased.

When magnitude of energy gap between the superlattice miniband formed in the superlattice structure of the first superlattice semiconductor layer and the superlattice miniband formed in the superlattice structure of the second superlattice semiconductor layer is equal to or smaller than the total sum of LO phonon energy of a material for the barrier layer of the first superlattice semiconductor layer and thermal energy kT (k representing a Boltzmann constant and T representing an absolute temperature) at room temperature, carriers can more efficiently gather from the conduction band first superlattice miniband of the superlattice structure of the first superlattice semiconductor layer to the conduction band first superlattice miniband of the superlattice structure of the second superlattice semiconductor layer owing to fast relaxation through the miniband or LO phonon scattering. Therefore, efficiency in extraction of carriers from the light receiving element is enhanced.

Extraction of carriers from the light receiving element will specifically be described hereinafter with reference to FIGS. 2 and 3. The number of superlattice minibands shown in FIGS. 2 and 3 is by way of example, and can be adjusted as appropriate.

Figure 2:
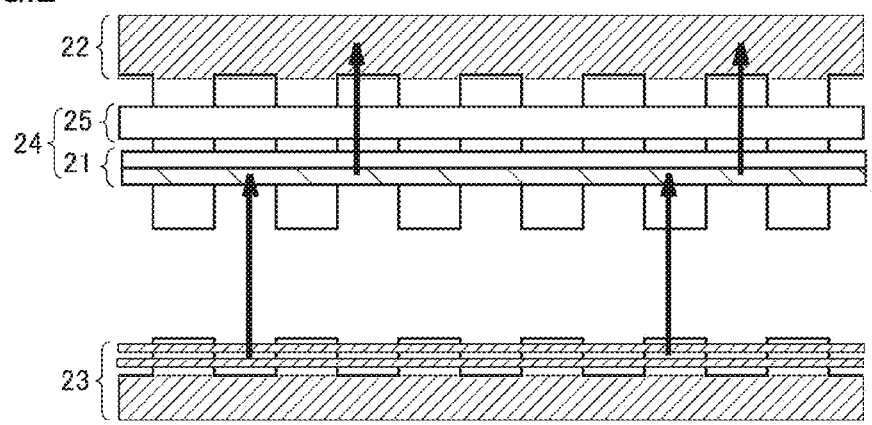
FIG. 2 is a schematic band diagram showing extraction of carriers by photoexcitation through a conduction band first superlattice miniband formed when one type of superlattice semiconductor layer is employed.
Figure 3:
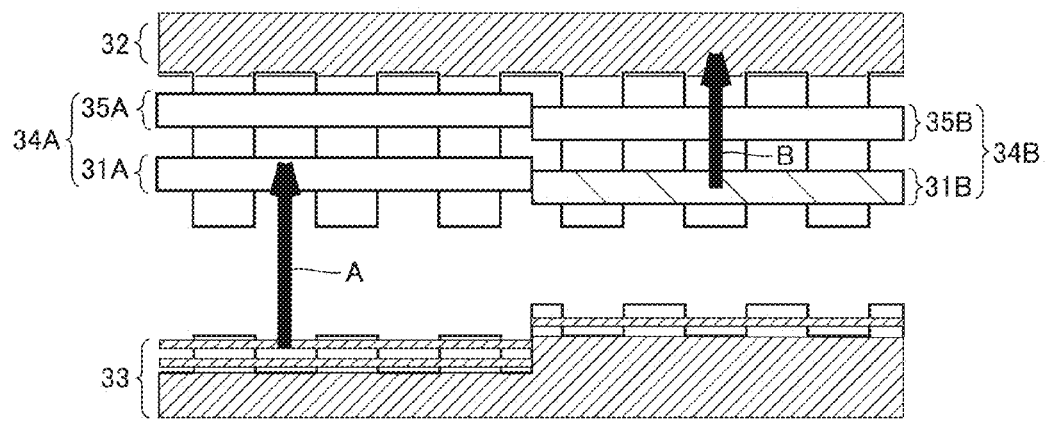
FIG. 3 is a schematic band diagram showing extraction of carriers by photoexcitation through the conduction band first superlattice miniband formed in a superlattice semiconductor layer in the first embodiment of the present invention.

FIG. 2 is a schematic band diagram showing extraction of carriers through the conduction band first superlattice miniband formed when one type of superlattice semiconductor layer is employed. A hatched portion in FIG. 2 represents presence of electrons.

As described above, by controlling a shape of the quantum dot, a material for the quantum dot, a thickness of the barrier layer, or a material for the barrier layer, a superlattice miniband 24 shown in FIG. 2 is formed in the superlattice semiconductor layer. Superlattice miniband 24 includes a conduction band first superlattice miniband 21 and a conduction band second or higher superlattice miniband 25.

When light is incident on the superlattice semiconductor layer, as shown with an arrow, transition of electrons from a valence band 23 to conduction band first superlattice miniband 21 and transition of electrons from conduction band first superlattice miniband 21 to a conduction band 22 or higher of the barrier layer occur. Though not clearly shown in FIG. 2, transition of electrons from valence band 23 to conduction band 22 or conduction band second or higher superlattice miniband 25 not through conduction band first superlattice miniband 21 also occurs.

As a result of photoexcitation through such a conduction band first superlattice miniband, electrons can be generated in the conduction band of the bather layer and holes can be generated in the valence band of the barrier layer. Thus, photoelectric conversion can be carried out and photovoltaic power can be generated.

FIG. 3 is a schematic band diagram showing extraction of carriers through the conduction band first superlattice miniband formed in the superlattice semiconductor layer in the present embodiment. A hatched portion in FIG. 3 represents presence of electrons.

In the superlattice semiconductor layer in the present embodiment, as shown in FIG. 3, a superlattice miniband 34A is formed in the first superlattice semiconductor and a superlattice miniband 34B is formed in the second superlattice semiconductor layer. Superlattice miniband 34A includes a conduction band first superlattice miniband 31A and a conduction band second or higher superlattice miniband 35A. Superlattice miniband 34B includes a conduction band first superlattice miniband 31B and a conduction band second or higher superlattice miniband 35B. Conduction band first superlattice miniband 31B is lower in lower end energy than conduction band first superlattice miniband 31A.

In FIG. 3, since conduction band first superlattice miniband 31B is lower in lower end energy than conduction band first superlattice miniband 31A, carriers in conduction band first superlattice miniband 31A promptly migrate to conduction band first superlattice miniband 31B. Therefore, no carriers are present in conduction band first superlattice miniband 31A of first superlattice semiconductor layer 10A arranged on the side of p-type semiconductor layer 4 and conduction band first superlattice miniband 31B of second superlattice semiconductor layer 10B arranged on the side of n-type semiconductor layer 1 is filled with carriers.

When conduction band first superlattice miniband 31A and conduction band first superlattice miniband 31B overlap in part with each other or when magnitude of energy gap between conduction band first superlattice miniband 31A and conduction band first superlattice miniband 31B is equal to or smaller than the total sum of LO phonon energy of a material for the barrier layer of the first superlattice semiconductor layer and thermal energy kT at room temperature, carriers in conduction band first superlattice miniband 31A are relaxed fast to conduction band first superlattice miniband 31B through the miniband or LO phonon scattering.

Here, when light is incident on the superlattice semiconductor layer, in first superlattice semiconductor layer 10A, as shown with an arrow A, electrons make transition from the valence band to conduction band first superlattice miniband 31A. Electrons which have made transition to conduction band first superlattice miniband 31A promptly migrate to conduction band first superlattice miniband 31B. Then, in second superlattice semiconductor layer 10B, as shown with an arrow B, electrons make transition from conduction band first superlattice miniband 31B to the conduction band second or higher superlattice miniband. Since second superlattice semiconductor layer 10B is formed from the superlattice structure of the type II structure, carrier recombination can be suppressed and a lifetime of carriers can be extended. Therefore, electrons within conduction band first superlattice miniband 31B are more susceptible to second-step photoexcitation owing to high carrier occupation probability and a long lifetime of carriers. Therefore, the light receiving element according to the present embodiment can provide a device excellent in efficiency in extraction of carriers.

When second superlattice semiconductor layer 10B having the superlattice structure of the type II structure is arranged on the side of n-type semiconductor layer 1, carriers excited from the conduction band first superlattice miniband to the conduction band second or higher superlattice miniband are efficiently extracted to n-type semiconductor layer 1 before recombination or relaxation. Therefore, a device including such a light receiving element can achieve improvement in a short-circuit current.

The second superlattice semiconductor layer may be doped with an impurity. Since carrier occupation probability in the superlattice structure low in lower end energy of the conduction band first superlattice miniband becomes high, probability of transition from the conduction band first superlattice miniband to the conduction band second or higher superlattice miniband increases.

A method of forming a miniband by repeatedly stacking the barrier layer and the quantum dot layer in the superlattice semiconductor layer as above can provide various options in design of the light receiving element. Therefore, a device excellent in efficiency in extraction of carriers can be provided.

<<Second Embodiment>>
[Construction of Solar Cell]

A construction of a solar cell including the light receiving element according to the present embodiment will be described with reference to FIG. 1.

Solar cell 20 includes on a p-type substrate 12 having a p-type electrode 17 formed on a back surface, a buffer layer 3, p-type semiconductor layer 4, first superlattice semiconductor layer 10A, second superlattice semiconductor layer 10B, n-type semiconductor layer 1, and a window layer 14 as being stacked in this order. The solar cell further includes an n-type electrode 18 on window layer 14 with a contact layer 15 being interposed.

For example, a p$^+$-GaAs layer can be employed as buffer layer 3. The buffer layer can have a thickness, for example, from 100 nm to 500 nm.

For example, a p-GaAs layer can be employed as p-type semiconductor layer 4. P-type semiconductor layer 4 can have a thickness, for example, from 20 nm to 3000 nm.

For example, an n-GaAs$_x$Sb$_{1-x}$, (0≤x≤1) layer can be employed as n-type semiconductor layer 1. N-type semiconductor layer 1 can have a thickness, for example, from 20 nm to 3000 nm.

For example, an n-Al$_{0.75}$Ga$_{0.25}$As layer can be employed as window layer 14. The window layer can have a thickness, for example, from 10 nm to 300 nm.

For example, an $n^+$-$GaAs_xSb_{1-x}$ (0≤x≤1) layer can be employed as contact layer 15. The contact layer can have a thickness, for example, from 10 nm to 500 nm.

For p-type electrode 17, for example, Ti/Pt/Au, Au/Zn, Au/Cr, Ti/Au, or Au/Zn/Au can be employed. The p-type electrode can have a thickness, for example, from 10 nm to 500 nm.

For n-type electrode 18, for example, Au/AuGeNi, AuGe/Ni/Au, Au/Ge, or Au/Ge/Ni/Au can be employed. The n-type electrode can have a thickness, for example, from 10 nm to 500 nm.

The solar cell according to the present embodiment can also be combined with a light concentrating system.

[Method of Manufacturing Solar Cell]

Initially, p-type substrate 12 composed of p-GaAs is cleaned with an organic cleaning solution and thereafter etched with a sulfuric acid based etchant. After further cleaning with running water for 10 minutes, p-type substrate 12 is supported in an MOCVD apparatus. Then, buffer layer 3 is formed on p-type substrate 12. As buffer layer 3, a $p^+$-GaAs layer having a thickness of 300 nm is preferably formed. Formation of buffer layer 3 can improve crystallinity of a superlattice semiconductor layer (a light absorption layer) formed on buffer layer 3. Therefore, solar cell 20 having ensured efficiency in light reception in the superlattice semiconductor layer can be provided. Thereafter, p-type semiconductor layer 4 is formed on buffer layer 3. As p-type semiconductor layer 4, a p-GaAs layer having a thickness of 300 nm is preferably formed.

In succession, first superlattice semiconductor layer 10A including barrier layer 8A and quantum dot layer 6A is formed on p-type semiconductor layer 4. Bather layer 8A can be formed with molecular beam epitaxy (MBE) or metal organic chemical vapor deposition (MOCVD), and quantum dot layer 6A can be grown with a method called Stranski-Krastanov (S-K) growth. Specifically, for example, after crystal growth of a GaAs layer as barrier layer 8A, owing to a self-assembly mechanism, quantum dots 7A composed of indium gallium arsenide $In_xGa_{1-x}As$ (x=1) are formed and crystal growth of a GaAs layer the same as the barrier layer is carried out in a portion where quantum dots 7A are not formed. Quantum dot layer 6A is thus formed. Thereafter, crystal growth of the GaAs layer as barrier layer 8A and growth of quantum dot layer 6A are repeated. A method of growing quantum dot layer 6 is as described above.

Then, second superlattice semiconductor layer 10B including barrier layer 8B and quantum dot layer 6B is formed on first superlattice semiconductor layer 10A. Methods of growing barrier layer 8B and quantum dot layer 6B can be the same as the methods for barrier layer 8A and quantum dot layer 6A, respectively. For example, preferably, a $GaAs_xSb_{1-x}$ layer (0≤x≤1) is employed as barrier layer 8B and $In_xGa_{1-x}As$ (x=1) is employed for quantum dots 7B.

Thereafter, a cap layer is preferably formed. As the cap layer, a $GaAs_xSb_{1-x}$ layer (0≤x≤1) having a thickness of approximately 4 nm is preferably formed, and formation of the cap layer can recover flatness of a surface of a crystal. The superlattice semiconductor layer is thus formed.

In succession, n-type semiconductor layer 1 is formed on first superlattice semiconductor layer 10B. As n-type semiconductor layer 1, an n-$GaAs_xSb_{1-x}$ (0≤x≤1) layer having a thickness of 250 nm is preferably formed. A pin structure is thus formed.

In succession, window layer 14 and contact layer 15 are formed on n-type semiconductor layer 1. Crystal growth of an n-$Al_{0.75}Ga_{0.25}As$ layer as window layer 14 to a thickness of 50 nm is preferred. Crystal growth of an $n^+$-$GaAs_xSb_{1-x}$ (0≤x≤1) layer as contact layer 15 to a thickness of 100 nm is preferred. Thereafter, this stack is taken out of the MOCVD apparatus and then a p-type electrode is formed on a lower surface of the p-type substrate. Thereafter, n-type electrode (a comb-shaped electrode) 18 is formed on contact layer 15 with photolithography and the lift-off technique, and contact layer 15 is selectively etched with this n-type electrode 18 serving as a mask. Solar cell 20 according to the present embodiment can thus be obtained.

Here, preferably, a substrate processing temperature is set, for example, to 520° C. at the time when the superlattice semiconductor layer including the quantum dot layer is formed in order to prevent elimination again of In, and set to 590° C. at the time when layers other than that are formed.

For example, Si can be employed as an n-type dopant and Be can be employed as a p-type dopant. The n-type dopant is preferably added during crystal growth of at least one of the quantum dot layer and the barrier layer. P-type electrode 17 and n-type electrode 18 are preferably made of Au as a material, and are preferably formed through vacuum vapor deposition with the resistance heating vapor deposition method.

Examples shown in the present embodiment are merely by way of example. Each material for the p-type substrate, the buffer layer, the p-type semiconductor layer, the superlattice semiconductor layer, the n-type semiconductor layer, the window layer, the contact layer, the n-type dopant, the p-type dopant, the n-type electrode, and the p-type electrode, a cleaning agent used in each process, a substrate processing temperature, and a manufacturing apparatus are not limited to those described above.

<<Third Embodiment>>

[Quantum-Type Infrared Sensor]

The light receiving element in the first embodiment can be employed for a quantum-type infrared sensor.

In connection with the quantum-type infrared sensor including quantum dots, in order to obtain an infrared sensor having high quantum efficiency and high sensitivity, carriers photoexcited by infrared absorption are desirably extracted at high efficiency from a quantum level of the conduction band. The superlattice semiconductor layer described in the first embodiment can allow extraction of photoexcited carriers at high efficiency. Therefore, the quantum-type infrared sensor including the light receiving element in the first embodiment can have high quantum efficiency and high sensitivity.

<<Fourth Embodiment>>

[Construction of Light Receiving Element]

Figure 28:
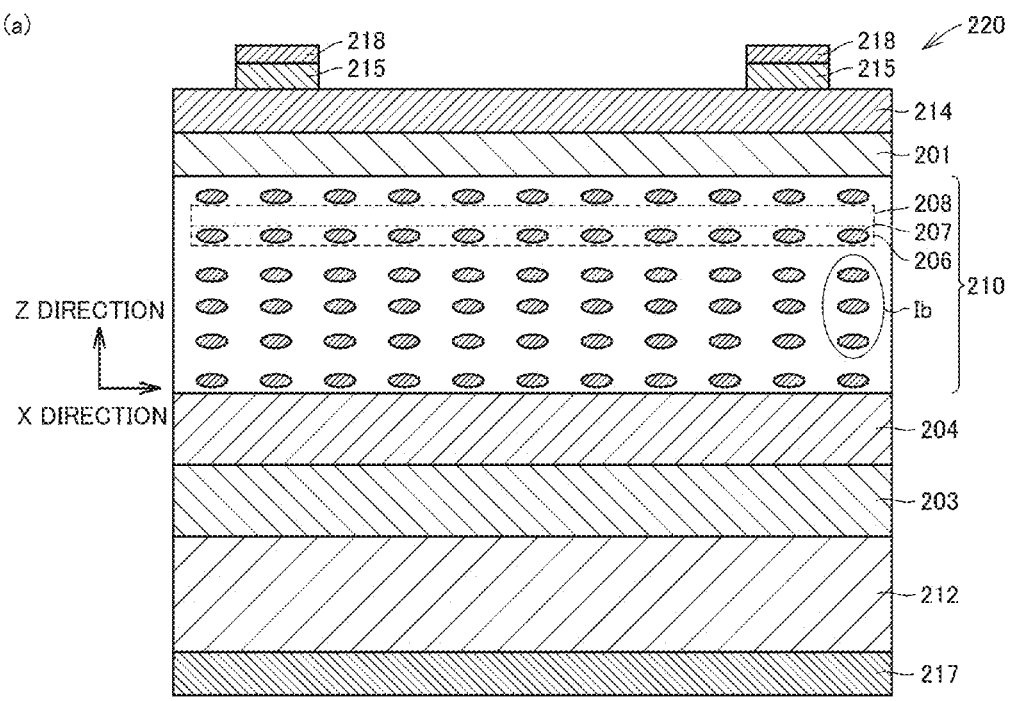
FIG. 28 is (a) a schematic cross-sectional view showing a construction of a solar cell including a light receiving element according to a fourth embodiment of the present invention and (b) an enlarged view of an Ib portion in (a).
Figure 28:
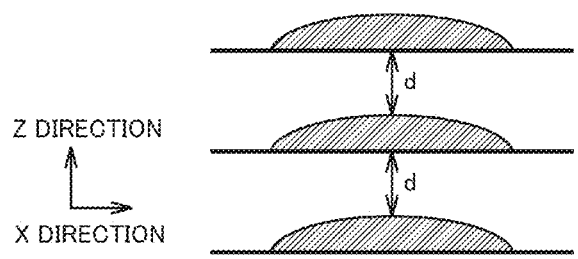

FIG. 28 (a) is a schematic cross-sectional view showing a construction of a solar cell including a light receiving element according to a fourth embodiment of the present invention. The light receiving element has superlattice semiconductor layer 10 having the superlattice structure in which barrier layer 8 and quantum dot layer 6 containing quantum dots 7 are alternately and repeatedly stacked.

Preferably, the light receiving element further includes p-type semiconductor layer 1 and n-type semiconductor layer 4 as well as the superlattice structure lying between the p-type semiconductor layer and the n-type semiconductor layer.

<Superlattice Semiconductor Layer>

Superlattice semiconductor layer 10 is arranged between n-type semiconductor layer 4 and p-type semiconductor layer 1.

Superlattice semiconductor layer 10 has the superlattice structure in which barrier layer 8 and quantum dot layer 6 are alternately and repeatedly stacked. In quantum dot layer 6, a plurality of quantum dots 7 are arranged in a semiconductor material the same as that for barrier layer 8. The band structure of the superlattice structure of the superlattice semiconductor layer is the type II structure.

Though not shown in FIG. 28, in the superlattice semiconductor layer, an insertion layer such as a cap layer or a quantum well different in material from the quantum dot layer and the barrier layer may repeatedly be stacked together with the quantum dot layer and the barrier layer.

Though each material for the quantum dots and the barrier layer is not particularly limited, a group III-V compound semiconductor is preferably employed. The quantum dots are preferably made of a semiconductor material lower in band gap energy than the barrier layer. For example, each material for the quantum dots and the barrier layer is preferably $GaAs_xSb_{1-x}$, $AlSb$, $InAs_xSb_{1-x}$, $Ga_xIn_{1-x}Sb$, $AlSb_xAs_{1-x}$, $AlAs$, $In_xGa_{1-x}As$, $Al_xGa_{1-x}As$, $Al_yGa_{1-y}As_zSb_{1-z}$, $In_xGa_{1-x}P$, $(Al_yGa_{1-y})_zIn_{1-z}P$, $GaAs_xP_{1-x}$, $Ga_yIn_{1-y}As_zP_{1-z}$, or $In_xAl_{1-x}As$ (in all of which materials a condition of $0≤x≤1$, $0≤y≤1$, and $0≤z≤1$ is satisfied, which is also the case hereinafter), and may be a mixed crystal material thereof.

Each material for the quantum dots and the bather layer may be a group IV semiconductor in the periodic table, a compound semiconductor made of a group III semiconductor material and a group V semiconductor material, or a compound semiconductor made of a group II semiconductor material and a group VI semiconductor material, or may be a mixed crystal material thereof. Alternatively, each material for the quantum dots and the barrier layer may be a chalcopyrite-based material or a semiconductor other than the chalcopyrite-based material.

For example, as combination of a material for the quantum dots and a material for the barrier layer which form the type II structure from which the effect of the present invention is obtained (hereinafter, A and B in A/B representing a material for the quantum dots and a material for the barrier layer, respectively), $In_xGa_{1-x}As/GaAs_xSb_{1-x}$, $In_xGa_{1-x}As/Al_yGa_{1-y}As_zSb_{1-z}$, $In_xGa_{1-x}As/AlAs_zSb_{1-z}$, $InAs_xSb_{1-x}/GaAs_xSb_{1-x}$, $InAs_xSb_{1-x}/Al_yGa_{1-y}As_zSb_{1-z}$, or $InAs_xSb_{1-x}/AlAs_zSb_{1-z}$ is preferably employed.

The superlattice semiconductor layer may be formed from an i-type semiconductor layer or from a semiconductor layer containing a p-type impurity or an n-type impurity so long as electromotive force is generated by light reception.

In the present embodiment, the quantum dot layer contains In and As and the barrier layer has the superlattice structure containing at least any of Ga and Al as well as As and Sb.

In the quantum dot structure of the type II structure, a value q represented by a composition ratio of the barrier layer Sb/(Sb+As) and a distance d (nm) between quantum dots in the direction of stack of the superlattice semiconductor layer are optimized, so that a radiative lifetime can significantly be extended. Specifically, in the quantum dot structure of the type II structure, by decreasing distance d between quantum dots in the direction of stack, overlap of wave functions between a conduction band ground level and a valence band ground level can extremely be made smaller and a radiative lifetime between the conduction band ground level and the valence band ground level can significantly be extended.

Value q represented by the composition ratio of the barrier layer Sb/(Sb+As) and distance d (nm) between quantum dots in the direction of stack of the superlattice semiconductor layer satisfy relation in Expression A below.

$$q≥(3d+10)/100 \quad \text{(Expression A)}$$

Distance d (nm) between quantum dots in the direction of stack of the superlattice semiconductor layer means distance d between an upper end of a quantum dot located below in the direction of stack and a wetting layer in a lower portion of a quantum dot located above in the direction of stack, between the quantum dots located at the shortest distance from each other in the direction of stack (a Z direction) shown in FIG. 28 (b). Though not shown in FIG. 28 (b), when there is no wetting layer, distance d between an upper end of a quantum dot located below in the direction of stack and a lower portion of a quantum dot located above in the direction of stack, between the quantum dots located at the shortest distance from each other in the direction of stack (the Z direction), is meant.

Expression A is obtained as an approximate expression by calculating a radiative lifetime with a composition ratio of the barrier layer Sb/(Sb+As) and distance d (nm) between the quantum dots in the direction of stack of the superlattice semiconductor layer being variously changed, in a realistic quantum dot size and quantum dot composition obtained with a general fabrication method.

When the superlattice semiconductor layer satisfies Expression A above, owing to such effects as strain distribution in connection with the quantum dot structure and the type II structure, overlap of wave functions between the conduction band ground level and the valence band ground level becomes extremely small and a radiative lifetime between the conduction band ground level and the valence band ground level can be longer by an order of magnitude than a radiative lifetime at the time when the quantum dot structure is the type I structure (approximately 1 to 2 ns) and efficiency in extraction of carriers from the light receiving element can significantly be enhanced.

Value q represented by a composition ratio of the barrier layer Sb/(Sb+As) and distance d (nm) between quantum dots in the direction of stack of the superlattice semiconductor layer satisfy relation in Expression B below.

$$q≥(3d+15)/100 \quad \text{(Expression B)}$$

Here, a radiative lifetime can be longer by two orders of magnitude than a radiative lifetime at the time when the quantum dot structure is the type I structure (approximately 1 to 2 ns) and efficiency in extraction of carriers from the light receiving element can further be enhanced.

Preferably, the quantum dot has a height in the direction of stack of the quantum dot layer from 0.5 to 50 nm and a diameter in an in-plane direction of the quantum dot layer from 0.5 to 100 nm.

<N-Type Semiconductor Layer>

N-type semiconductor layer 4 is made of a semiconductor containing an n-type impurity.

In the fourth embodiment, in solar cell 20, n-type semiconductor layer 4 is located opposite to the light incident side of superlattice semiconductor layer 10, however, n-type semiconductor layer 4 can also be located on the light incident side of superlattice semiconductor layer 10.

The n-type semiconductor layer can form a pin junction or a pn junction (including a pn–n junction, a pp–n junction, a p+pn junction, and a pnn+ junction) together with the superlattice semiconductor layer and the p-type semiconductor layer. Electromotive force is generated by light reception by the pin junction or the pn junction.

The n-type semiconductor layer can be formed from a thin film formed with CVD or MBE.

The n-type semiconductor layer may be a layer obtained by adding an n-type impurity to a semiconductor material the same as that for the barrier layer or a layer obtained by adding an n-type impurity to a semiconductor material different from that for the barrier layer.

The n-type semiconductor layer is preferably composed of n-GaAsSb, n-GaAs, n-AlGaAs, n-AlGaAsSb, n-AlAsSb, or n-InAlAs.

A concentration of an n-type impurity in the n-type semiconductor layer is not particularly limited, and it is preferably set as appropriate depending on a semiconductor material forming the n-type semiconductor layer.

A thickness of the n-type semiconductor layer is not particularly limited, and it is preferably set as appropriate such that light can sufficiently be absorbed by the superlattice semiconductor layer.

<P-Type Semiconductor Layer>

The p-type semiconductor layer is made of a semiconductor containing a p-type impurity.

In the fourth embodiment, in solar cell 220, p-type semiconductor layer 201 is located on the light incident side of superlattice semiconductor layer 210, however, p-type semiconductor layer 201 can also be located opposite to the light incident side of superlattice semiconductor layer 210.

The p-type semiconductor layer can form a pin junction or a pn junction (including a pn–n junction, a pp–n junction, a p+pn junction, and a pnn+ junction) together with the superlattice semiconductor layer and n-type semiconductor layer 204. Electromotive force is generated by light reception by the pin junction or the pn junction.

The p-type semiconductor layer is preferably formed from a thin film formed with CVD or MBE.

The p-type semiconductor layer may be a layer obtained by adding a p-type impurity to a semiconductor material the same as that for the barrier layer or a layer obtained by adding a p-type impurity to a semiconductor material different from that for the barrier layer.

The p-type semiconductor layer is preferably composed of p-GaAs, p-GaAsSb, p-AlGaAs, p-AlGaAsSb, p-AlAsSb, or p-InAlAs.

A concentration of a p-type impurity in the p-type semiconductor layer is not particularly limited, and it is preferably set as appropriate depending on a semiconductor material forming the p-type semiconductor layer.

A thickness of the p-type semiconductor layer is not particularly limited, and it is preferably set as appropriate such that light can sufficiently be absorbed by the superlattice semiconductor layer.

<<Fifth Embodiment>>

A light receiving element in a fifth embodiment is basically the same in construction as in the fourth embodiment. A difference from the fourth embodiment is that an n-type semiconductor layer is employed instead of p-type semiconductor 1. Thus, the light receiving element in the fifth embodiment includes an nin junction formed by two n-type semiconductor layers and a superlattice semiconductor layer lying therebetween. By further including an electrode, carriers generated as a result of light reception are extracted and a function as the light receiving element can be achieved.

<<Sixth Embodiment>>

[Construction of Solar Cell]

A construction of a solar cell including the light receiving element according to the fourth embodiment will be described with reference to FIG. 28.

The solar cell includes an n-type electrode 217, an n-type substrate 212, buffer layer 203, n-type semiconductor layer 204, superlattice semiconductor layer 210, p-type semiconductor layer 201, and window layer 214 as being stacked in this order. The solar cell further includes a p-type electrode 218 on window layer 214 with contact layer 215 being interposed.

The solar cell according to the present embodiment can also be combined with a light concentrating system.

For example, an $n^+$-$GaAs_xSb_{1-x}$ layer ($0 \leq x \leq 1$) can be employed as the buffer layer. The buffer layer can have a thickness, for example, from 100 nm to 500 nm.

For example, an n-$GaAs_xSb_{1-x}$ layer ($0 \leq x \leq 1$) can be employed as the n-type semiconductor layer. The n-type semiconductor layer can have a thickness, for example, from 20 nm to 3000 nm.

For example, a p-$GaAs_xSb_{1-x}$ layer ($0 \leq x \leq 1$) can be employed as the p-type semiconductor layer. The p-type semiconductor layer can have a thickness, for example, from 20 nm to 3000 nm.

For example, a p-$Al_{0.75}Ga_{0.25}As$ layer can be employed as the window layer. The window layer can have a thickness, for example, from 10 nm to 300 nm.

For example, a $p^+$-$GaAs_xSb_{1-x}$ layer ($0 \leq x \leq 1$) can be employed as the contact layer. The contact layer can have a thickness, for example, from 10 nm to 500 nm.

For the p-type electrode, for example, Ti/Pt/Au, Au/Zn, Au/Cr, Ti/Au, or Au/Zn/Au can be employed. The p-type electrode can have a thickness, for example, from 10 nm to 500 nm.

For the n-type electrode, for example, Au/AuGeNi, AuGe/Ni/Au, Au/Ge, or Au/Ge/Ni/Au can be employed. The n-type electrode can have a thickness, for example, from 10 nm to 500 nm.

[Method of Manufacturing Solar Cell]

One example of a method of manufacturing a solar cell will be described hereinafter.

Initially, n-type substrate 212 composed of n-GaAs is cleaned with an organic cleaning solution, and thereafter etched with a sulfuric acid based etchant. After further cleaning with running water for 10 minutes, n-type substrate 212 is supported in an MOCVD apparatus. Then, buffer layer 203 is formed on n-type substrate 212. As buffer layer 203, an $n^+$-$GaAs_xSb_{1-x}$ layer ($0 \leq x \leq 1$) having a thickness of 300 nm is preferably formed. Formation of buffer layer 203 can improve crystallinity of a superlattice semiconductor layer (a light absorption layer) formed on buffer layer 203. Therefore, solar cell 220 having ensured efficiency in light reception in the superlattice semiconductor layer can be provided. Thereafter, n-type semiconductor layer 204 is formed on buffer layer 203. As n-type semiconductor layer 204, an n-$GaAs_xSb_{1-x}$ layer ($0 \leq x \leq 1$) having a thickness of 300 nm is preferably formed.

In succession, superlattice semiconductor layer 210 including the barrier layer and the quantum dot layer is formed on n-type semiconductor layer 204. Formation with molecular beam epitaxy (MBE) or metal organic chemical vapor deposition (MOCVD) can be carried out, and the quantum dots can be grown with a method called Stranski-Krastanov (S-K) growth. Specifically, for example, after crystal growth of a $GaAs_xSb_{1-x}$ layer ($0 \leq x \leq 1$) as the barrier layer, owing to a self-assembly mechanism, the quantum dots composed of indium gallium arsenide $In_xGa_{1-x}As$ (x=1) are formed and crystal growth of $GaAs_xSb_{1-x}$ the same as the barrier layer is carried out in a portion where the quantum dots are not formed. The quantum dot layer is thus formed. Thereafter, crystal growth of the $GaAs_xSb_{1-x}$ layer as the barrier layer and growth of the quantum dot layer are repeated. A method of growing the quantum dot layer is as described above.

Thereafter, a cap layer is preferably formed. As the cap layer, a $GaAs_xSb_{1-x}$ layer ($0 \leq x \leq 1$) having a thickness of approximately 4 nm is preferably formed, and formation of the cap layer can recover flatness of a surface of a crystal. The superlattice semiconductor layer is thus formed.

In the superlattice semiconductor layer, an insertion layer such as a cap layer or a quantum well different in material from the quantum dot layer and the barrier layer may repeatedly be stacked together with the quantum dot layer and the barrier layer.

In succession, p-type semiconductor layer 201 is formed on the superlattice semiconductor layer. As the p-type semiconductor layer, a p-$GaAs_xSb_{1-x}$ layer ($0 \leq x \leq 1$) having a thickness of 250 nm is preferably formed. A pin structure is thus formed.

In succession, window layer 214 and contact layer 215 are formed on the p-type semiconductor layer. Crystal growth of a p-$Al_{0.75}Ga_{0.25}As$ layer as the window layer to a thickness of 50 nm is preferred. Crystal growth of a $p^+$-$GaAs_xSb_{1-x}$ layer ($0 \leq x \leq 1$) as the contact layer to a thickness of 100 nm is preferred. Thereafter, this stack is taken out of the MOCVD apparatus and then an n-type electrode is formed on a surface of the n-type substrate opposite to the buffer layer. Thereafter, a p-type electrode (a comb-shaped electrode) is formed on the contact layer with photolithography and the lift-off technique, and the contact layer is selectively etched with this p-type electrode serving as a mask. The solar cell according to the present embodiment is thus obtained.

Here, preferably, a substrate processing temperature is set, for example, to 520° C. at the time when the superlattice semiconductor layer including the quantum dot layer is formed in order to prevent elimination again of In, and set to 590° C. at the time when layers other than that are formed.

For example, Si can be employed as an n-type dopant and Be can be employed as a p-type dopant. The n-type dopant is preferably added during crystal growth of at least one of the quantum dot layer and the barrier layer. The p-type electrode and the n-type electrode are preferably made of Au as a material, and are preferably formed through vacuum vapor deposition with the resistance heating vapor deposition method.

Examples shown in the present embodiment are merely by way of example. Each material for the n-type substrate, the buffer layer, the n-type semiconductor layer, the superlattice semiconductor layer, the p-type semiconductor layer, the window layer, the contact layer, the n-type dopant, the p-type dopant, the n-type electrode, and the p-type electrode, a cleaning agent used in each process, a substrate processing temperature, and a manufacturing apparatus are not limited to those described above.

<<Seventh Embodiment>>

[Quantum-Type Infrared Sensor]

The light receiving element in the fourth embodiment can be employed for a quantum-type infrared sensor.

In connection with the quantum-type infrared sensor including quantum dots, in order to obtain an infrared sensor having high quantum efficiency and high sensitivity, carriers photoexcited by infrared absorption are desirably extracted at high efficiency from a quantum level of a conduction band.

The superlattice semiconductor layer described in the fourth embodiment can allow extraction of photoexcited carriers at high efficiency. Therefore, the quantum-type infrared sensor including the light receiving element in the fourth embodiment can have high quantum efficiency and high sensitivity.

EXAMPLE 1

EXPERIMENTAL EXAMPLE 1

The light receiving element in one embodiment of the present invention was subjected to a simulation experiment.

[Evaluation Method]

A miniband structure of a superlattice structure, a light absorption spectrum, and a radiative lifetime were simulated by using the 8-band k•p Hamiltonian plane wave expansion method in consideration of influence by strain and a piezo electric field effect. A light absorption coefficient α and a radiative lifetime can be estimated by solving (Expression 1) and (Expression 2) below, respectively.

$$\alpha(\omega) = \frac{e^2}{2\bar{n}c\,\epsilon_0\,m_0^2\omega L_x L_y} \int dK_z \sum_{i,f} |e \cdot p_{if}|^2 (f_i - f_f) G \quad \text{(Expression 1)}$$

In (Expression 1) above, $p_{if}$ represents a matrix element, i and f each represent a sub band number, $\bar{n}$ represents an index of refraction, c represents a velocity of light, $\epsilon_0$ represents a vacuum dielectric constant, $m_0$ represents an electron mass, e represents elementary charge, $L_x$ and $L_y$ represent unit cell sizes in an x direction (a (100) direction) and a y direction (a (010) direction), respectively, $K_z$ represents a superlattice wave number, $f_i$ and $f_f$ each represent a distribution function, G represents Gaussian broadening (half-width=5 meV) owing to size variation and composition variation, and ω represents an optical frequency. With regard to light absorption, an x polarized wave (100) or a y polarized wave (010) which is in the in-plane direction of the quantum dot layer was regarded as TE polarization and a z polarized wave (001) which is in the direction of stack of the quantum dot layer was regarded as TM polarization.

$$\frac{1}{\tau_{if}} = \frac{1}{3} \frac{\bar{n}e^2(E_i - E_f)}{\pi\hbar^2 c^3 \varepsilon_0 m_0^2} \left( |\hat{e}_x \cdot p_{if}|^2 + |\hat{e}_y \cdot p_{if}|^2 + |\hat{e}_z \cdot p_{if}|^2 \right) \quad \text{(Expression 2)}$$

In (Expression 2) above, $E_i$-$E_f$ represents magnitude of energy between transitions, $\bar{n}$ represents a value calculated by dividing a Planck constant by twice of circular constant π, $\hat{e}_x$ represents a unit vector of x polarization, $\hat{e}_y$ represents a unit vector of y polarization, and $\hat{e}_z$ represents a unit vector of z polarization.

In Experimental Example 1, the miniband structure was calculated separately for two types of superlattice semiconductor layers and a light absorption spectrum and a radiative lifetime were simulated.

In the first superlattice semiconductor layer, gallium arsenide (GaAs) was employed as a base semiconductor material forming the barrier layer and indium arsenide (InAs) was employed as a quantum dot material, and in the second superlattice semiconductor layer, gallium arsenide antimony ($GaAs_{0.80}Sb_{0.20}$) was employed as a base semiconductor material forming the barrier layer and indium arsenide (InAs) was employed as a quantum dot material. In the present Experimental Example, $GaAs_xSb_{1-x}$ was employed as the base semiconductor material and $In_yGa_{1-y}As$ was employed as the quantum dot material, however, values for x and y can be changed as appropriate and a different semiconductor material may be employed.

In both of the first superlattice semiconductor layer on the side of the p-type semiconductor layer and the second superlattice semiconductor layer on the side of the n-type semiconductor layer, a quantum dot had a lens shape including a wetting layer of 0.5 nm, a diameter size in the in-plane direction of 15 nm, and a size (a height) in the direction of stack of 3 nm. A distance in the in-plane direction between quantum dots was set to 20 nm and a distance in the direction of stack between quantum dots was set to 3 nm. The first superlattice semiconductor layer had a thickness of 3 µm and the second superlattice semiconductor layer had a thickness of 3 µm, so that the entire superlattice semiconductor layer had a thickness of 6 µm.

Figure 4:
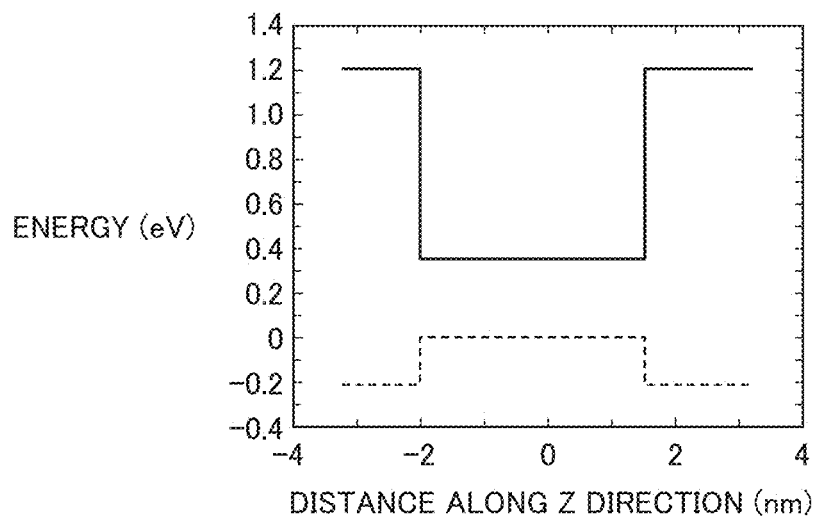
FIG. 4 is a diagram of potential distribution before consideration of strain in a conduction band and a valence band (heavy holes and light holes) of a first superlattice semiconductor layer calculated in Experimental Example 1.
Figure 5:
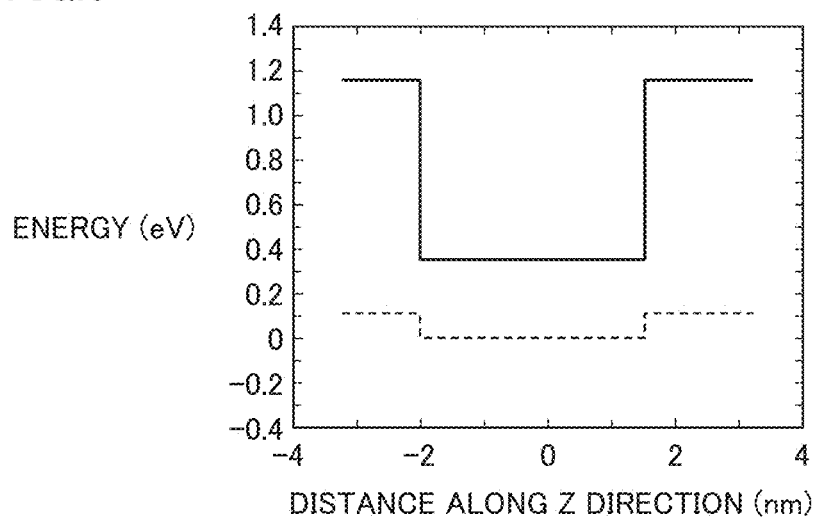
FIG. 5 is a diagram of potential distribution before consideration of strain in a conduction band and a valence band (heavy holes and light holes) of a second superlattice semiconductor layer calculated in Experimental Example 1.

FIGS. 4 and 5 show potential distribution before consideration of strain in the conduction band and the valence band (heavy holes and light holes) of respective one of the first superlattice semiconductor layer and the second superlattice semiconductor layer calculated in the present Experimental Example. The abscissa represents a distance in the direction of stack (the z direction in FIG. 1) of quantum dot centers and the ordinate represents energy. Magnitude of energy was found with a vertex of the valence band before consideration of influence by strain in a material forming the quantum dots being defined as a base point. The solid line represents potential distribution of the conduction band and the dashed line represents potential distribution of the valence band.

As can be seen in FIGS. 4 and 5, the band structure of the superlattice structure of the first superlattice semiconductor layer is the type I structure and the band structure of the superlattice structure of the second superlattice semiconductor layer is the type II structure.

Figure 6:
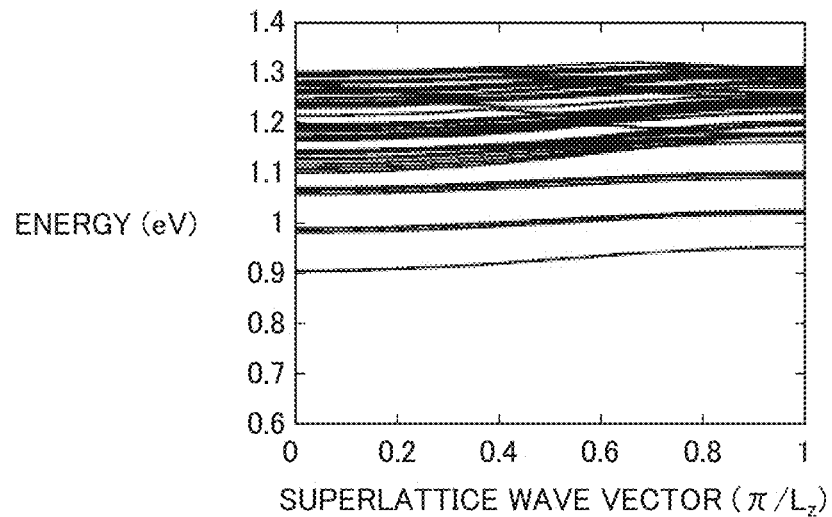
FIG. 6 is a diagram of a miniband structure in the conduction band of the first superlattice semiconductor layer calculated in Experimental Example 1.
Figure 7:
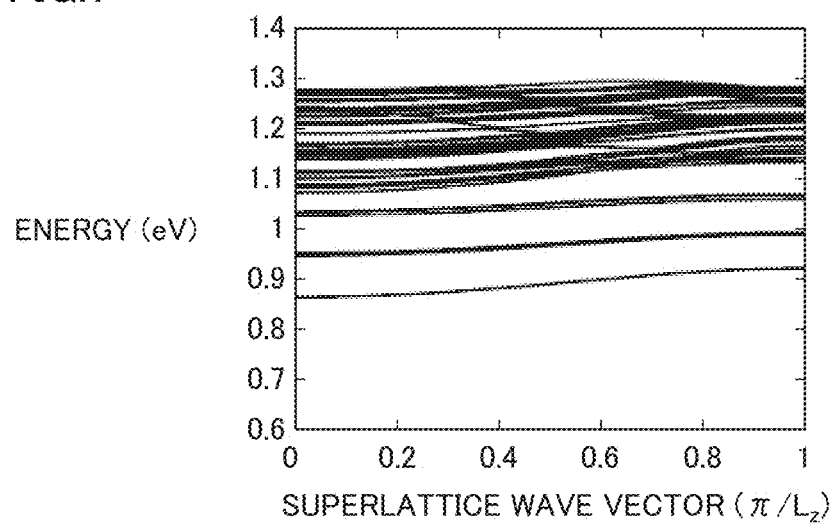
FIG. 7 is a diagram of a miniband structure in the conduction band of the second superlattice semiconductor layer calculated in Experimental Example 1.

FIGS. 6 and 7 show miniband structures (superlattice minibands up to the 50th being illustrated) in the conduction bands of the first superlattice semiconductor layer and the second superlattice semiconductor layer calculated in the present Experimental Example, respectively. In FIGS. 6 and 7, the abscissa represents a superlattice wave vector and the ordinate represents energy. Magnitude of energy was found with a vertex of the valence band before consideration of influence by strain in a material forming the quantum dots being defined as a base point.

As can be seen in FIGS. 6 and 7, it was found that the superlattice miniband was formed in the conduction band in the direction of stack of the quantum dot layer in the first superlattice semiconductor layer and the second superlattice semiconductor layer. Magnitude of lower end energy and upper end energy of the conduction band first superlattice miniband of the first superlattice semiconductor layer was 0.905 eV and 0.953 eV, and magnitude of lower end energy and upper end energy of the conduction band first superlattice miniband of the second superlattice semiconductor layer was 0.865 eV and 0.922 eV. Namely, in Experimental Example 1, since the conduction band first superlattice minibands of the first superlattice semiconductor layer and the second superlattice semiconductor layer overlap in part with each other, rapid relaxation is achieved. Since the second superlattice semiconductor layer has the type II structure, electrons and holes are spatially separated, a lifetime of carriers is long, and carrier recombination can be suppressed.

Figure 8:
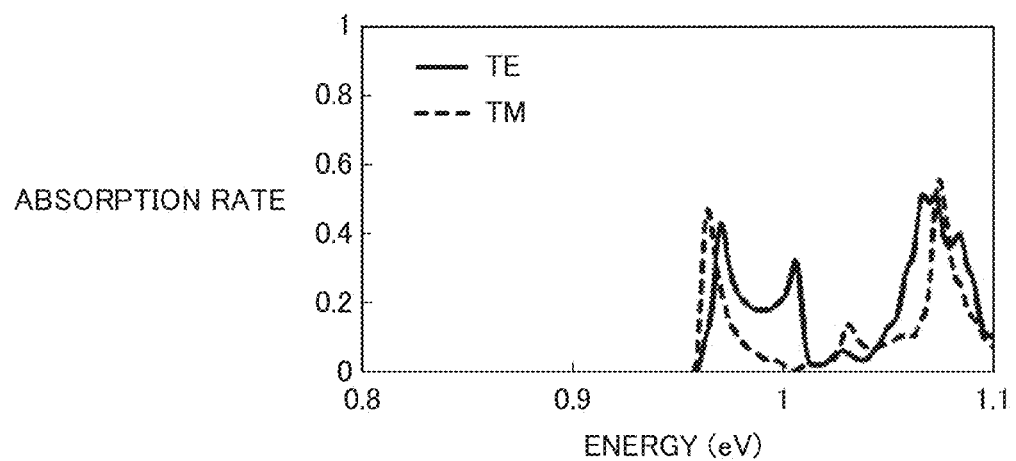
FIG. 8 is a graph showing results of calculation of optical absorption rate in transition from the valence band to the conduction band first superlattice miniband and a conduction band second or higher superlattice miniband calculated in Experimental Example 1.
Figure 9:
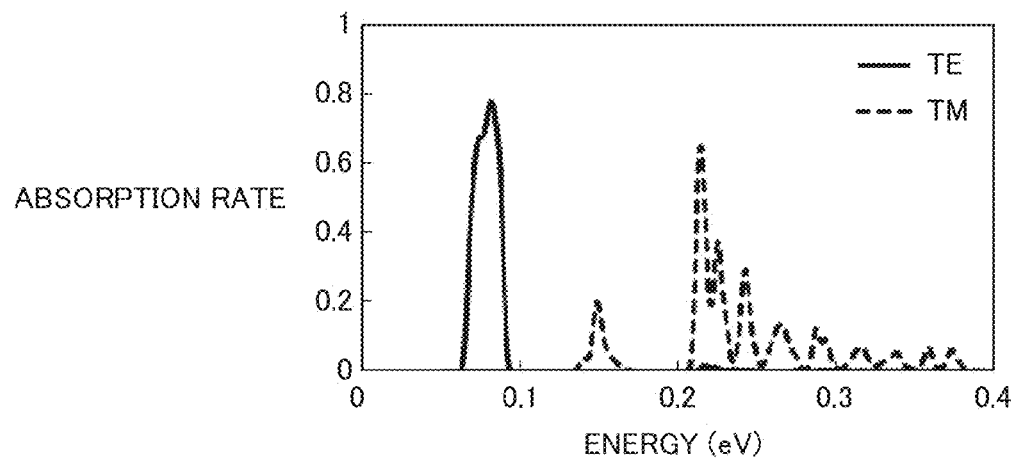
FIG. 9 is a graph showing results of calculation of optical absorption rate in transition from the conduction band first superlattice miniband to the conduction band second or higher superlattice miniband calculated in Experimental Example 1.

FIG. 8 shows results of calculation of optical absorption rate in transition from the valence band to the conduction band first superlattice miniband and the conduction band second or higher superlattice miniband, and FIG. 9 shows results of calculation of optical absorption rate in transition from the conduction band first superlattice miniband to the conduction band second or higher superlattice miniband. In the present Experimental Example, carriers generated in the conduction band first superlattice miniband of the first superlattice semiconductor layer were all assumed to migrate to the conduction band first superlattice miniband of the second superlattice semiconductor layer. In calculation in connection with transition from the valence band to the conduction band first superlattice miniband and the conduction band second or higher superlattice miniband of the first superlattice semiconductor layer, it was assumed that the valence band was filled with carriers, and it was assumed that the conduction band first superlattice miniband and the conduction band second or higher superlattice miniband had no carriers (were empty) (($f_i-f_f$)=1 in (Expression 1) above). In calculation in connection with transition from the conduction band first superlattice miniband of the second superlattice semiconductor layer to the conduction band second or higher superlattice miniband of the second superlattice semiconductor layer, it was assumed that the conduction band first superlattice miniband was filled with carriers, and it was assumed that the conduction band second or higher superlattice miniband had no carriers (was empty) (($f_i-f_f$)=1 in (Expression 1) above). In FIGS. 8 and 9, the abscissa represents energy and the ordinate represents optical absorption rate. In Experimental Example 1, since carriers are subjected to second-step photoexcitation in the second superlattice semiconductor layer close to the n-type semiconductor layer, carriers are promptly extracted from the n-type semiconductor layer.

A radiative lifetime in the second superlattice semiconductor layer was calculated with the use of Expression 2, and it was 6 ns at superlattice wave number $K_z$=0, between the conduction band first superlattice miniband and a valence band first superlattice miniband.

COMPARATIVE EXPERIMENTAL EXAMPLE 1

In Comparative Experimental Example 1, it was assumed that the superlattice semiconductor layer was formed only from the superlattice structure of the type I structure in Experimental Example 1 above, and the miniband structure was calculated and a light absorption spectrum and a radiative lifetime were simulated. The entire superlattice semiconductor layer had a thickness of 6 µm.

Potential distribution before consideration of strain in the conduction band and the valence band (heavy holes and light holes) of the superlattice structure calculated in the present Comparative Experimental Example and miniband structures in the conduction band (superlattice minibands up to the 50th being illustrated) are as shown in FIGS. 4 and 6. Unlike Experimental Example 1 above, the superlattice semiconductor layer is formed only from the superlattice structure of the type I structure. Therefore, migration of carriers generated in the superlattice miniband is gentle over the entire superlattice semiconductor layer.

Figure 10:
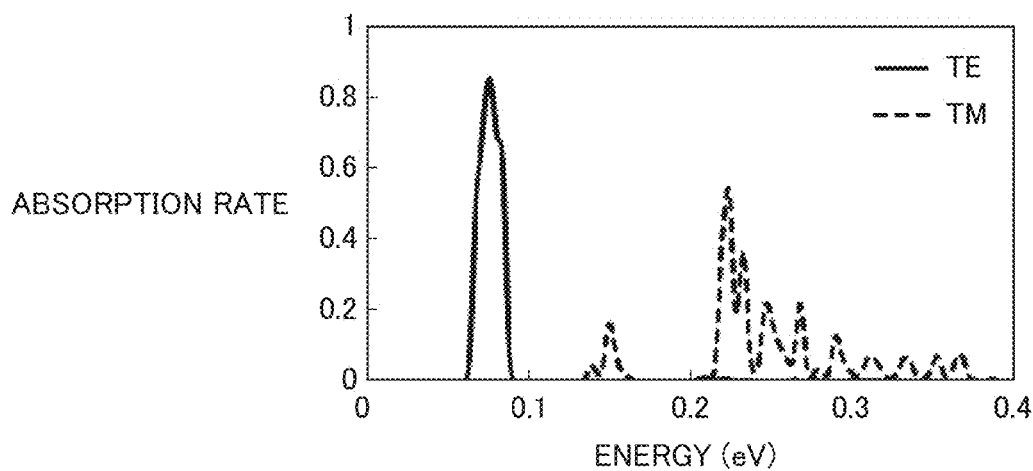
FIG. 10 is a graph showing results of calculation of optical absorption rate in transition from the conduction band first superlattice miniband to the conduction band second or higher superlattice miniband calculated in Comparative Experimental Example 1.

Then, optical absorption rate in transition from the valence band to the conduction band first superlattice miniband and the conduction band second or higher superlattice miniband and optical absorption rate in transition from the conduction band first superlattice miniband to the conduction band second or higher superlattice miniband were calculated. Here, ($f_i-f_f$) in (Expression 1) above was assumed as 0.5. Therefore, based on relation with a film thickness of the superlattice structure which is an absorption layer, a result of the optical absorption rate in transition from the valence band to the conduction band first superlattice miniband and the conduction band second or higher superlattice miniband was the same as in FIG. 8. FIG. 10 shows optical absorption rate in transition from the conduction band first superlattice miniband to the conduction band second or higher superlattice miniband.

A radiative lifetime was calculated with the use of Expression 2, and it was 3 ns at superlattice wave number $K_z$=0, between the conduction band first superlattice miniband and the valence band first superlattice miniband.

<Discussion>

Light absorption in transition from the valence band to the conduction band first superlattice miniband and the conduction band second or higher superlattice miniband was the same between the superlattice semiconductor layer in Experimental Example 1 and the superlattice semiconductor layer in Comparative Experimental Example 1, and no noticeable difference in an absorption band or an absorption coefficient was observed in light absorption in transition from the conduction band first superlattice miniband to the conduction band second or higher superlattice miniband. On the other hand, Experimental Example 1 was twice longer than Comparative Experimental Example 1 in a radiative lifetime between the conduction band first superlattice miniband and the valence band first superlattice miniband. Therefore, since Experimental Example 1 can achieve extension of a lifetime of carriers in the superlattice miniband without substantial change in light absorption in the second step through the superlattice miniband, it can achieve enhanced efficiency in two-step transition. Since the n-type semiconductor layer is arranged on the side of the second superlattice semiconductor layer, carriers subjected to second-step photoexcitation in the second superlattice semiconductor layer are promptly extracted from the n-type semiconductor layer. From the foregoing, it was confirmed that carriers generated in the conduction band first superlattice miniband were efficiently extracted to the n-type semiconductor layer before recombination or relaxation. Therefore, the light receiving element including the superlattice semiconductor layer in Experimental Example 1 can achieve an improved short-circuit current.

EXPERIMENTAL EXAMPLE 2

In Experimental Example 2, simulation was carried out in accordance with a method the same as in Experimental Example 1 above, except for change in a base semiconductor material forming the barrier layer.

In the first superlattice semiconductor layer, gallium arsenide (GaAs) was employed as a base semiconductor material forming the barrier layer and indium arsenide (InAs) was employed as a quantum dot material, and in the second superlattice semiconductor layer, gallium arsenide antimony ($GaAs_{0.65}Sb_{0.35}$) was employed as a base semiconductor material forming the barrier layer and indium arsenide (InAs) was employed as a quantum dot material.

Figure 11:
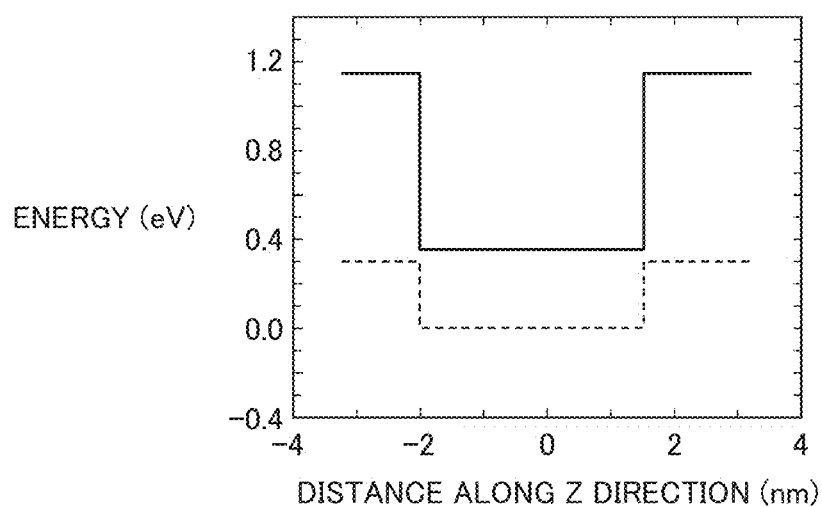
FIG. 11 is a diagram of potential distribution before consideration of strain in the conduction band and the valence band (heavy holes and light holes) of the second superlattice semiconductor layer calculated in Experimental Example 2.

FIG. 11 shows potential distribution before consideration of strain in the conduction band and the valence band (heavy holes and light holes) of the second superlattice semiconductor layer calculated in the present Experimental Example. The abscissa represents a distance in the direction of stack of quantum dot centers and the ordinate represents energy. Magnitude of energy was found with a vertex of the valence band before consideration of influence by strain in a material forming the quantum dots being defined as a base point. The solid line represents potential distribution of the conduction band and the dashed line represents potential distribution of the valence band. Potential distribution before consideration of strain in the conduction band and the valence band (heavy holes and light holes) in the first superlattice semiconductor layer is the same as in FIG. 4. As can be seen in FIG. 11, the band structure of the superlattice structure of the second superlattice semiconductor layer is the type II structure.

Figure 12:
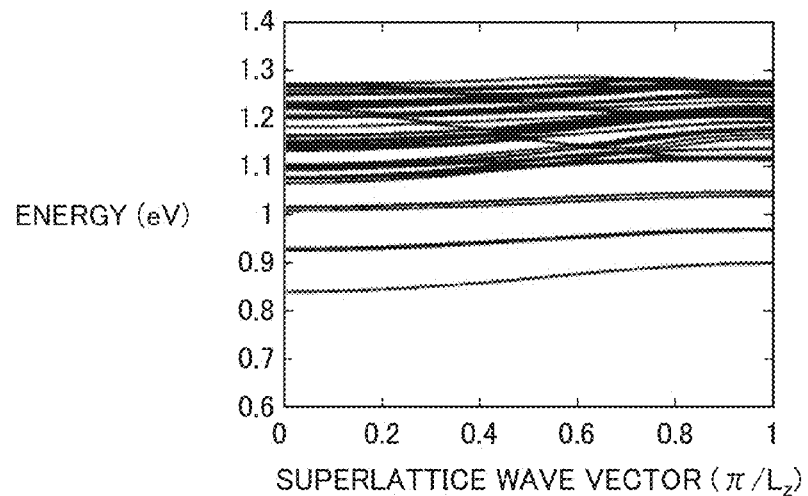
FIG. 12 is a diagram of a miniband structure in the conduction band of the second superlattice semiconductor layer calculated in Experimental Example 2.

FIG. 12 shows miniband structures (superlattice minibands up to the 50th being illustrated) in the conduction band of the second superlattice semiconductor layer calculated in the present Experimental Example. The abscissa represents a superlattice wave vector and the ordinate represents energy. Magnitude of energy was found with a vertex of the valence band before consideration of influence by strain in a material forming the quantum dots being defined as a base point. The miniband structure in the conduction band of the first superlattice semiconductor layer is the same as in FIG. 6. As can be seen in FIG. 12, it was found that, likewise the first superlattice semiconductor layer, in the second superlattice semiconductor layer, the superlattice miniband was formed in the conduction band in the direction of stack of the quantum dot layer. Magnitude of lower end energy and upper end energy of the conduction band first superlattice miniband of the second superlattice semiconductor layer was 0.841 eV and 0.901 eV. According to PHYSICAL REVIEW B, Vol. 82, page 195321, 2010, when energy gap between transition levels is in the vicinity of LO phonon energy of the barrier layer GaAs, rapid relaxation of the order of picoseconds to nanoseconds with LO phonon energy being defined as the center takes place. Specifically, even with the total sum of LO phonon energy (36 meV) and thermal energy (26 meV) at room temperature, fast relaxation at a ~10 ns level takes place. In Experimental Example 2, since magnitude of lower end energy and upper end energy of the conduction band first superlattice miniband of the first superlattice semiconductor layer is 0.905 eV and 0.953 eV, magnitude of energy gap between the conduction band first superlattice minibands of the first superlattice semiconductor layer and the second superlattice semiconductor layer is within the total sum of LO phonon energy (36 meV) of the barrier layer of the first superlattice semiconductor layer and thermal energy (26 meV) at room temperature. Therefore, in Experimental Example 2, there is transition energy gap matching with LO phonon energy between the conduction band first superlattice minibands of the first superlattice semiconductor layer and the second superlattice semiconductor layer, and fast relaxation through LO phonon scattering takes place. Since the second superlattice semiconductor layer has the type II structure, electrons and holes are spatially separated. Therefore, a lifetime of carriers is long and carrier recombination can be suppressed.

Figure 13:
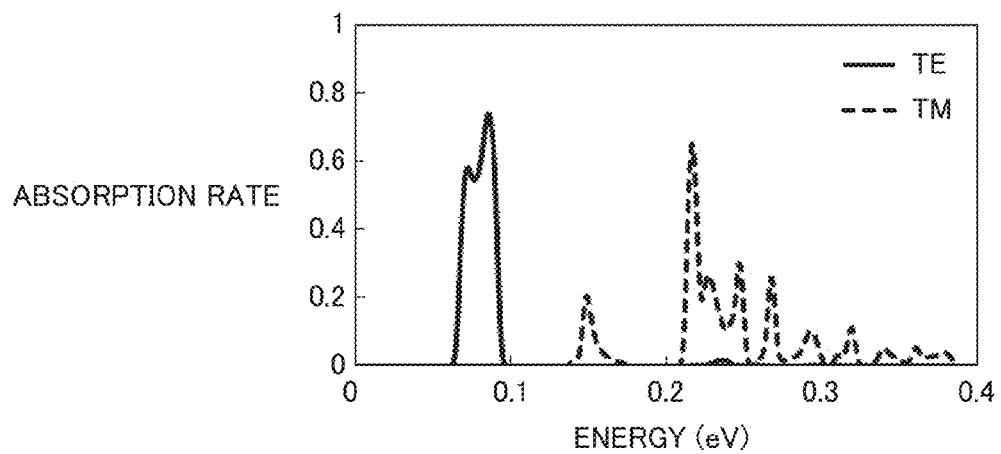
FIG. 13 is a graph showing results of calculation of optical absorption rate in transition from the conduction band first superlattice miniband to the conduction band second or higher superlattice miniband calculated in Experimental Example 2.

FIG. 13 shows results of calculation of optical absorption rate in transition from the conduction band first superlattice miniband to the conduction band second or higher superlattice miniband. The optical absorption rate in transition from the valence band to the conduction band first superlattice miniband and the conduction band second or higher superlattice miniband is the same as in FIG. 8. In the present Experimental Example, as in Experimental Example 1, carriers generated in the conduction band first superlattice miniband of the first superlattice semiconductor layer were all assumed to migrate to the conduction band first superlattice miniband of the second superlattice semiconductor layer. In calculation in connection with transition from the valence band to the conduction band first superlattice miniband and the conduction band second or higher superlattice miniband of the first superlattice semiconductor layer, it was assumed that the valence band was filled with carriers, and it was assumed that the conduction band first superlattice miniband and the conduction band second or higher superlattice miniband had no carriers (were empty) (($f_i-f_f$)=1 in (Expression 1) above). In calculation in connection with transition from the conduction band first superlattice miniband of the second superlattice semiconductor layer to the conduction band second or higher superlattice miniband of the second superlattice semiconductor layer, it was assumed that the conduction band first superlattice miniband was filled with carriers, and it was assumed that the conduction band second or higher superlattice miniband had no carriers (was empty) (($f_i-f_f$)=1 in (Expression 1) above). In FIG. 13, the abscissa represents energy and the ordinate represents optical absorption rate. In Experimental Example 2, since carriers are subjected to second-step photoexcitation in the second superlattice semiconductor layer close to the n-type semiconductor layer, carriers are promptly extracted from the n-type semiconductor layer.

A radiative lifetime in the second superlattice semiconductor layer was calculated with the use of Expression 2, and it was 304 ns between the conduction band first superlattice miniband and the valence band first superlattice miniband.

COMPARATIVE EXPERIMENTAL EXAMPLE 2

In Comparative Experimental Example 2, it was assumed that the superlattice semiconductor layer was formed only from the superlattice structure of the type I structure in Experimental Example 2 above, and the miniband structure was calculated and a light absorption spectrum and a radiative lifetime were simulated. Results were the same as in Comparative Experimental Example 1.

<Discussion>

Light absorption in transition from the valence band to the conduction band first superlattice miniband and the conduction band second or higher superlattice miniband was the same between the superlattice semiconductor layer in Experimental Example 2 and the superlattice semiconductor layer in Comparative Experimental Example 2, and no noticeable difference in an absorption band or an absorption coefficient was observed in light absorption in transition from the conduction band first superlattice miniband to the conduction band second or higher superlattice miniband. On the other hand, Experimental Example 2 was approximately 101 times longer than Comparative Experimental Example 2 in a radiative lifetime between the conduction band first superlattice miniband and the valence band first superlattice miniband. Therefore, since a lifetime of carriers in the superlattice miniband can be extended without substantial change in light absorption in the second step through the superlattice miniband, efficiency in two-step transition can be enhanced. Since the n-type semiconductor layer is arranged on the side of the second superlattice semiconductor layer, carriers subjected to the second-step photoexcitation in the second superlattice semiconductor layer are promptly extracted from the n-type semiconductor layer. From the foregoing, it was confirmed that carriers generated in the conduction band first superlattice miniband were efficiently extracted to the n-type semiconductor layer before recombination or relaxation even when the base semiconductor material forming the barrier layer was changed. Therefore, the light receiving element including the superlattice semiconductor layer in Experimental Example 2 can achieve an improved short-circuit current.

EXPERIMENTAL EXAMPLE 3

In Experimental Example 3, simulation was carried out in accordance with a method the same as in Experimental Example 1 above, except for change in a distance in the direction of stack between quantum dots.

In the first superlattice semiconductor layer, gallium arsenide (GaAs) was employed as a base semiconductor material forming the barrier layer and indium arsenide (InAs) was employed as a quantum dot material, and in the second superlattice semiconductor layer, gallium arsenide antimony ($GaAs_{0.80}Sb_{0.20}$) was employed as a base semiconductor material forming the barrier layer and indium arsenide (InAs) was employed as a quantum dot material.

In both of the first superlattice semiconductor layer on the side of the p-type semiconductor layer and the second superlattice semiconductor layer on the side of the n-type semiconductor layer, a quantum dot had a lens shape including a wetting layer of 0.5 nm, a diameter size in the in-plane direction of 15 nm, and a size (a height) in the direction of stack of 3 nm. A distance in the in-plane direction between the quantum dots was set to 20 nm and a distance in the direction of stack between the quantum dots was set to 8 nm. The first superlattice semiconductor layer had a thickness of 3 μm and the second superlattice semiconductor layer had a thickness of 3 μm, so that the entire superlattice semiconductor layer had a thickness of 6 μm.

Figure 14:
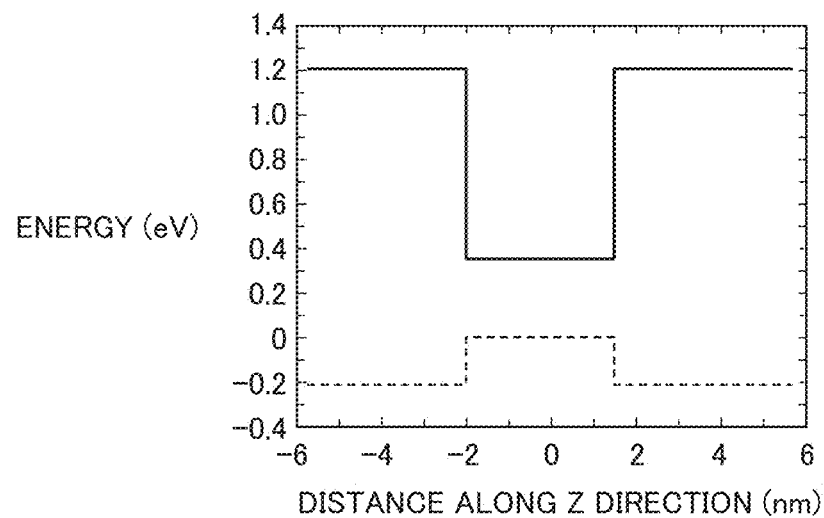
FIG. 14 is a diagram of potential distribution before consideration of strain in the conduction band and the valence band (heavy holes and light holes) of the first superlattice semiconductor layer calculated in Experimental Example 3.
Figure 15:
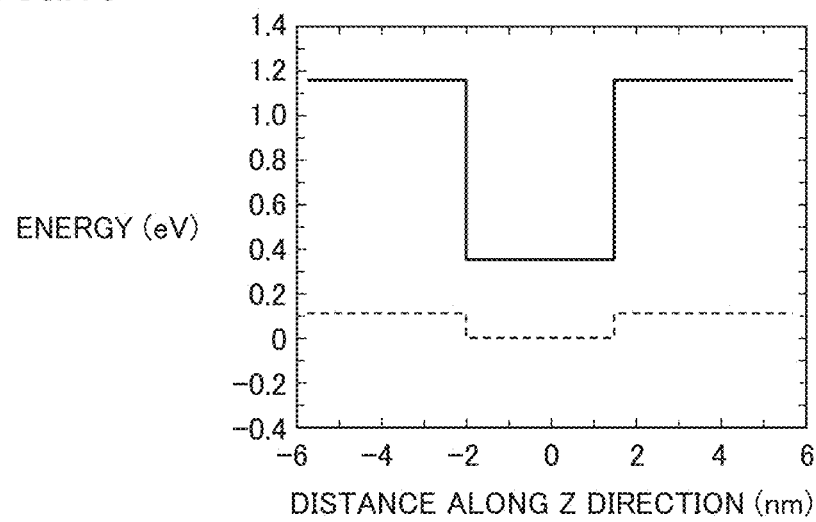
FIG. 15 is a diagram of potential distribution before consideration of strain in the conduction band and the valence band (heavy holes and light holes) of the second superlattice semiconductor layer calculated in Experimental Example 3.

FIGS. 14 and 15 show potential distribution before consideration of strain in the conduction band and the valence band (heavy holes and light holes) of respective one of the first superlattice semiconductor layer and the second superlattice semiconductor layer calculated in the present Experimental Example. The abscissa represents a distance in the direction of stack of quantum dot centers and the ordinate represents energy. Magnitude of energy was found with a vertex of the valence band before consideration of influence by strain in a material forming the quantum dots being defined as a base point. The solid line represents potential distribution of the conduction band and the dashed line represents potential distribution of the valence band. As can be seen in FIGS. 14 and 15, the band structure of the superlattice structure of the first superlattice semiconductor layer is the type I structure and the band structure of the superlattice structure of the second superlattice semiconductor layer is the type II structure.

Figure 16:
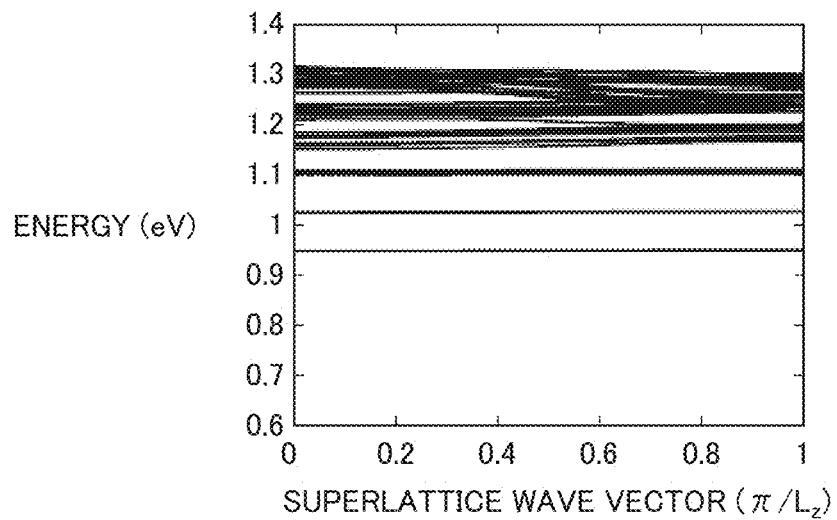
FIG. 16 is a diagram of a miniband structure in the conduction band of the first superlattice semiconductor layer calculated in Experimental Example 3.
Figure 17:
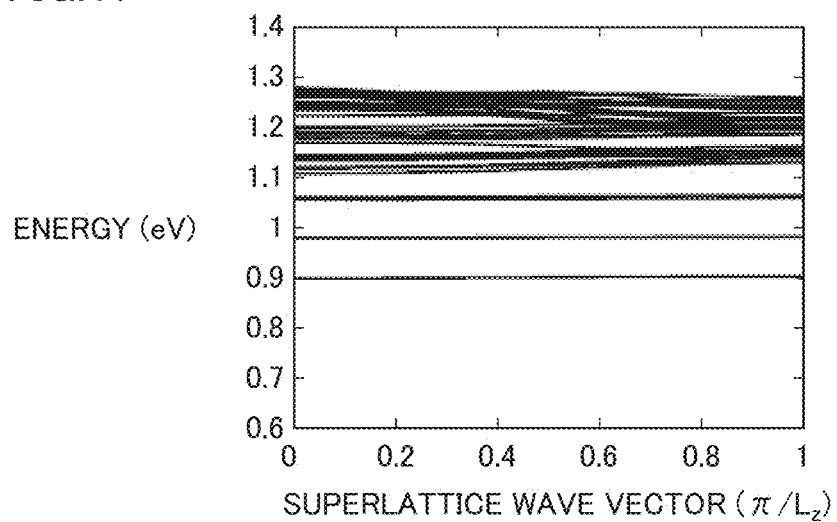
FIG. 17 is a diagram of a miniband structure in the conduction band of the second superlattice semiconductor layer calculated in Experimental Example 3.

FIGS. 16 and 17 show miniband structures (superlattice minibands up to the 50th being illustrated) in the conduction bands of the first superlattice semiconductor layer and the second superlattice semiconductor layer calculated in the present Experimental Example, respectively. In FIGS. 16 and 17, the abscissa represents a superlattice wave vector and the ordinate represents energy. Magnitude of energy was found with a vertex of the valence band before consideration of influence by strain in a material forming the quantum dots being defined as a base point. As can be seen in FIGS. 16 and 17, it was found that, in the first superlattice semiconductor layer and the second superlattice semiconductor layer, the superlattice miniband was formed in the conduction band in the direction of stack of the quantum dot layer. Magnitude of lower end energy and upper end energy of the conduction band first superlattice miniband of the first superlattice semiconductor layer was 0.946 eV and 0.948 eV and magnitude of lower end energy and upper end energy of the conduction band first superlattice miniband of the second superlattice semiconductor layer was 0.903 eV and 0.906 eV. Namely, magnitude of energy gap between the conduction band first superlattice minibands of the first superlattice semiconductor layer and the second superlattice semiconductor layer is within the total sum of LO phonon energy (36 meV) of the barrier layer of the first superlattice semiconductor layer and thermal energy (26 meV) at room temperature and carriers are relaxed fast through LO phonon scattering. Since the second superlattice semiconductor layer has the type II structure, electrons and holes are spatially separated. Therefore, a lifetime of carriers is long and carrier recombination can be suppressed.

Figure 18:
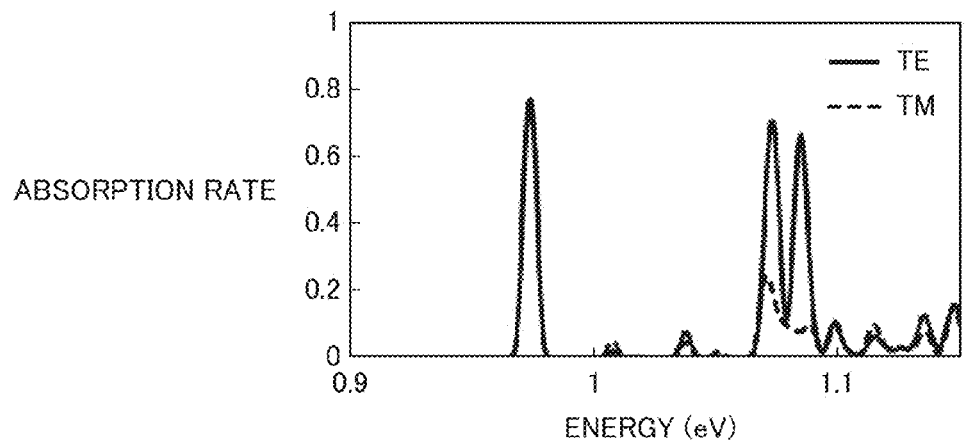
FIG. 18 is a graph showing results of calculation of optical absorption rate in transition from the valence band to the conduction band first superlattice miniband and the conduction band second or higher superlattice miniband calculated in Experimental Example 3.
Figure 19:
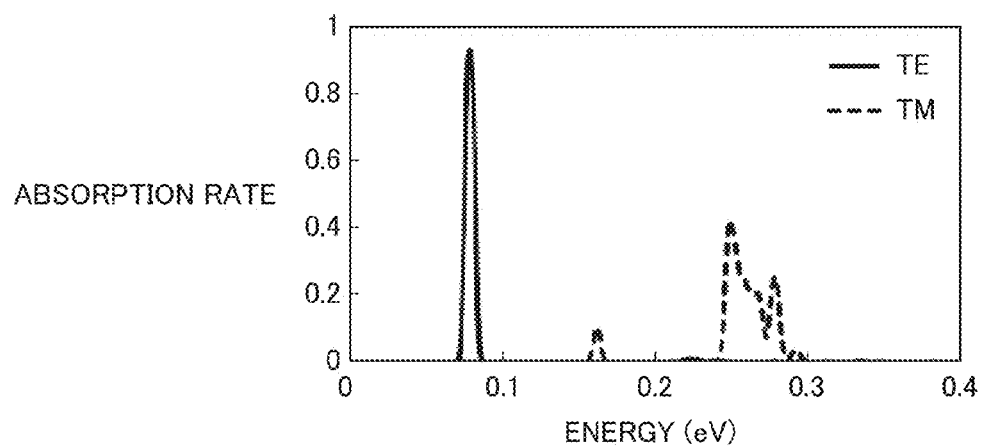
FIG. 19 is a graph showing results of calculation of optical absorption rate in transition from the conduction band first superlattice miniband to the conduction band second or higher superlattice miniband calculated in Experimental Example 3.

FIG. 18 shows results of calculation of optical absorption rate in transition from the valence band to the conduction band first superlattice miniband and the conduction band second or higher superlattice miniband, and FIG. 19 shows results of calculation of optical absorption rate in transition from the conduction band first superlattice miniband to the conduction band second or higher superlattice miniband. In the present Experimental Example, carriers generated in the conduction band first superlattice miniband of the first superlattice semiconductor layer were all assumed to migrate to the conduction band first superlattice miniband of the second superlattice semiconductor layer. In calculation in connection with transition from the valence band to the conduction band first superlattice miniband and the conduction band second or higher superlattice miniband of the first superlattice semiconductor layer, it was assumed that the valence band was filled with carriers, and it was assumed that the conduction band first superlattice miniband and the conduction band second or higher superlattice miniband had no carriers (were empty) $((f_i-f_f)=1$ in (Expression 1) above). In calculation in connection with transition from the conduction band first superlattice miniband of the second superlattice semiconductor layer to the conduction band second or higher superlattice miniband of the second superlattice semiconductor layer, it was assumed that the conduction band first superlattice miniband was filled with carriers, and it was assumed that the conduction band second or higher superlattice miniband had no carriers (was empty) $((f_i-f_f)=1$ in (Expression 1) above). In FIGS. 18 and 19, the abscissa represents energy and the ordinate represents optical absorption rate. In Experimental Example 3, since carriers are subjected to second-step photoexcitation in the second superlattice semiconductor layer close to the n-type semiconductor layer, carriers are promptly extracted from the n-type semiconductor layer.

A radiative lifetime in the second superlattice semiconductor layer was calculated with the use of Expression 2, and it was 14 ns at superlattice wave number $K_z=0$, between the conduction band first superlattice miniband and the valence band first superlattice miniband.

COMPARATIVE EXPERIMENTAL EXAMPLE 3

In Comparative Experimental Example 3, it was assumed that the superlattice semiconductor layer was formed only from the superlattice structure of the type I structure in Experimental Example 3 above, and the miniband structure was calculated and a light absorption spectrum and a radiative lifetime were simulated. The entire superlattice semiconductor layer had a thickness of 6 μm.

Potential distribution before consideration of strain in the conduction band and the valence band (heavy holes and light holes) of the superlattice structure calculated in the present Comparative Experimental Example and miniband structures in the conduction band (superlattice minibands up to the 50th being illustrated) are as shown in FIGS. 14 and 16. Unlike Experimental Example 3 above, the superlattice semiconductor layer is formed only from the superlattice structure of the type I structure. Therefore, migration of carriers generated in the superlattice miniband is gentle over the entire superlattice semiconductor layer.

Figure 20:
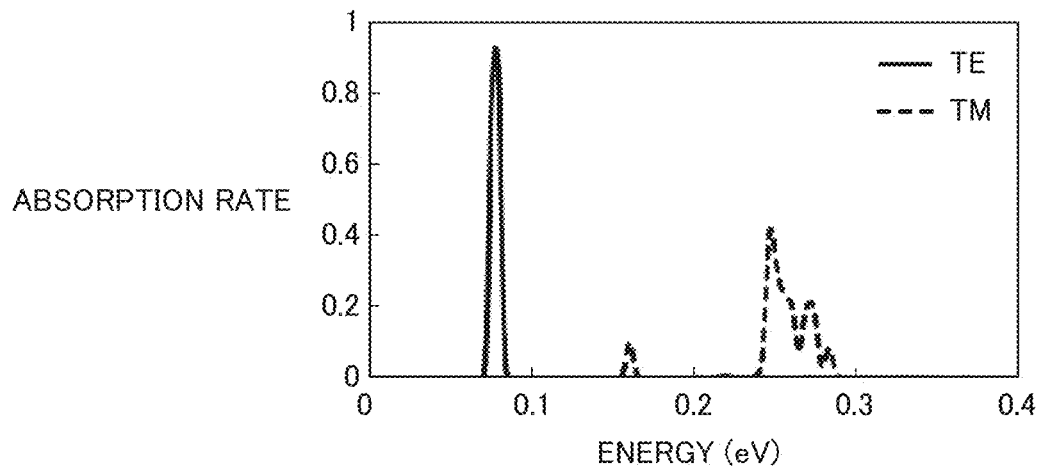
FIG. 20 is a graph showing results of calculation of optical absorption rate in transition from the conduction band first superlattice miniband to the conduction band second or higher superlattice miniband calculated in Comparative Experimental Example 3.

Optical absorption rate in transition from the valence band to the conduction band first superlattice miniband and the conduction band second or higher superlattice miniband and optical absorption rate in transition from the conduction band first superlattice miniband to the conduction band second or higher superlattice miniband were calculated. Here, $(f_i-f_f)$ in (Expression 1) above was assumed as 0.5. Therefore, based on relation with a film thickness of the superlattice structure which is an absorption layer, a result of the optical absorption rate in transition from the valence band to the conduction band first superlattice miniband and the conduction band second or higher superlattice miniband was the same as in FIG. 18. FIG. 20 shows optical absorption rate in transition from the conduction band first superlattice miniband to the conduction band second or higher superlattice miniband.

A radiative lifetime was calculated with the use of Expression 2, and it was 2 ns at superlattice wave number $K_z=0$, between the conduction band first superlattice miniband and the valence band first superlattice miniband.

<Discussion>

Light absorption in transition from the valence band to the conduction band first superlattice miniband and the conduction band second or higher superlattice miniband was the same between the superlattice semiconductor layer in Experimental Example 3 and the superlattice semiconductor layer in Comparative Experimental Example 3, and no noticeable difference in an absorption band or an absorption coefficient was observed in light absorption in transition from the conduction band first superlattice miniband to the conduction band second or higher superlattice miniband. On the other hand, Experimental Example 3 was seven times longer than Comparative Experimental Example 3 in a radiative lifetime between the conduction band first superlattice miniband and the valence band first superlattice miniband. Therefore, since a lifetime of carriers in the superlattice miniband can be extended without substantial change in light absorption in the second step through the superlattice miniband, efficiency in two-step transition can be enhanced. Since the n-type semiconductor layer is arranged on the side of the second superlattice semiconductor layer, carriers subjected to the second-step photoexcitation in the second superlattice semiconductor layer are promptly extracted from the n-type semiconductor layer. From the foregoing, it was confirmed that carriers generated in the conduction band first superlattice miniband were efficiently extracted to the n-type semiconductor layer before recombination or relaxation. Therefore, the light receiving element including the superlattice semiconductor layer in Experimental Example 3 can achieve an improved short-circuit current.

EXPERIMENTAL EXAMPLE 4

Simulation was carried out in accordance with a method the same as in Experimental Example 1 above, except for change in a quantum dot material in the first superlattice semiconductor layer.

In the first superlattice semiconductor layer, gallium arsenide (GaAs) was employed as a base semiconductor material forming the barrier layer and indium gallium arsenide ($In_{0.80}Ga_{0.20}As$) was employed as a quantum dot material, and in the second superlattice semiconductor layer, gallium arsenide antimony ($GaAs_{0.80}Sb_{0.20}$) was employed as a base semiconductor material forming the barrier layer and indium gallium arsenide ($In_{0.80}Ga_{0.20}As$) was employed as a quantum dot material.

In both of the first superlattice semiconductor layer on the side of the p-type semiconductor layer and the second superlattice semiconductor layer on the side of the n-type semiconductor layer, a quantum dot had a lens shape including a wetting layer of 0.5 nm, a diameter size in the in-plane direction of 15 nm, and a size (a height) in the direction of stack of 3 nm. A distance in the in-plane direction between the quantum dots was set to 20 nm and a distance in the direction of stack between the quantum dots was set to 3 nm. The first superlattice semiconductor layer had a thickness of 3 μm and the second superlattice semiconductor layer had a thickness of 3 μm, so that the entire superlattice semiconductor layer had a thickness of 6 μm.

Figure 21:
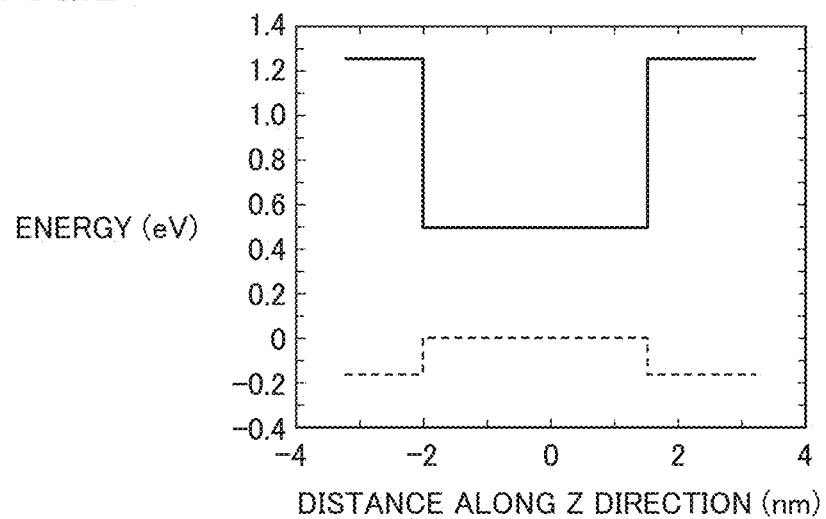
FIG. 21 is a diagram of potential distribution before consideration of strain in the conduction band and the valence band (heavy holes and light holes) of the first superlattice semiconductor layer calculated in Experimental Example 4.
Figure 22:
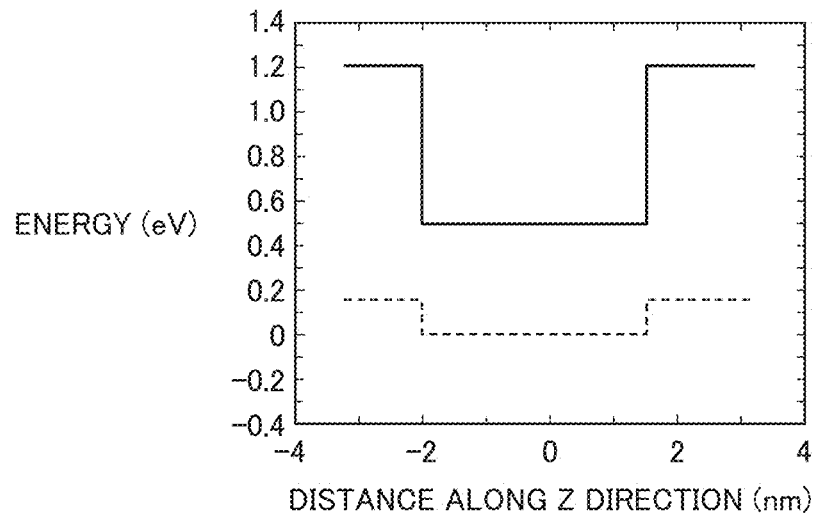
FIG. 22 is a diagram of potential distribution before consideration of strain in the conduction band and the valence band (heavy holes and light holes) of the second superlattice semiconductor layer calculated in Experimental Example 4.

FIGS. 21 and 22 show potential distribution before consideration of strain in the conduction band and the valence band (heavy holes and light holes) of respective one of the first superlattice semiconductor layer and the second superlattice semiconductor layer calculated in the present Experimental Example. The abscissa represents a distance in the direction of stack of quantum dot centers and the ordinate represents energy. Magnitude of energy was found with a vertex of the valence band before consideration of influence by strain in a material forming the quantum dots being defined as a base point. The solid line represents potential distribution of the conduction band and the dashed line represents potential distribution of the valence band. As can be seen in FIGS. 21 and 22, the band structure of the superlattice structure of the first superlattice semiconductor layer is the type I structure and the band structure of the superlattice structure of the second superlattice semiconductor layer is the type II structure.

Figure 23:
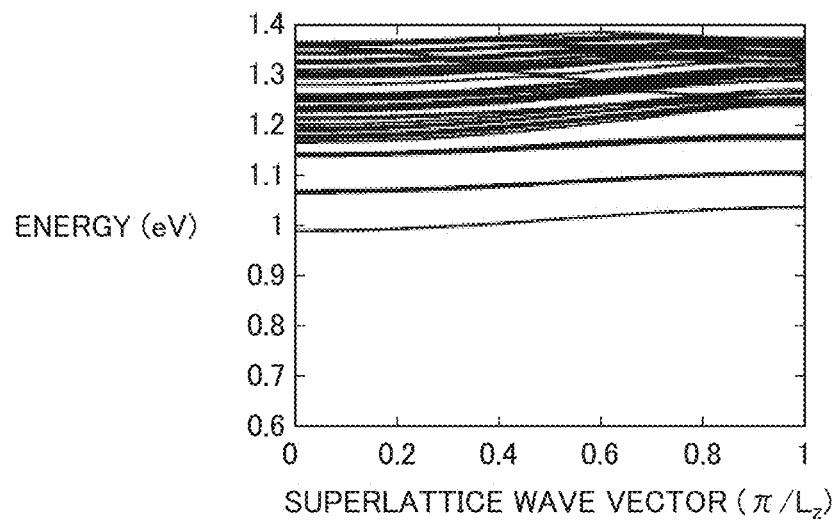
FIG. 23 is a diagram of a miniband structure in the conduction band of the first superlattice semiconductor layer calculated in Experimental Example 4.
Figure 24:
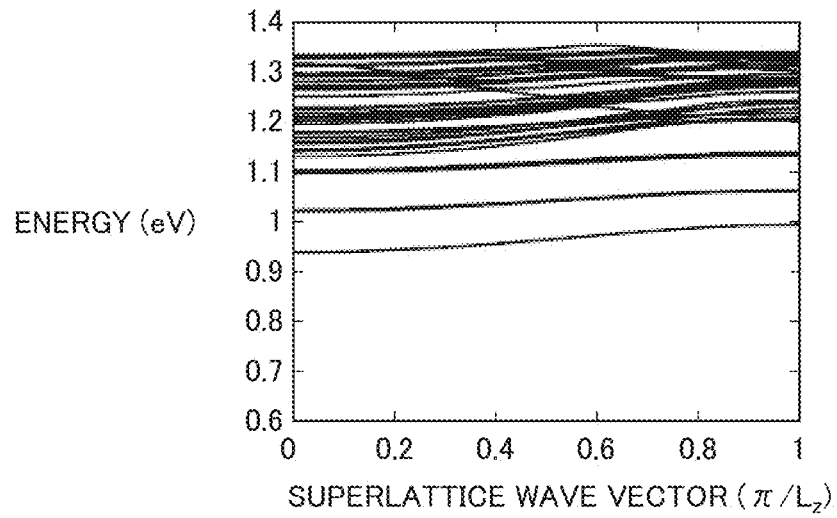
FIG. 24 is a diagram of a miniband structure in the conduction band of the second superlattice semiconductor layer calculated in Experimental Example 4.

FIGS. 23 and 24 show miniband structures (superlattice minibands up to the 50th being illustrated) in the conduction bands of the first superlattice semiconductor layer and the second superlattice semiconductor layer calculated in the present Experimental Example, respectively. In FIGS. 23 and 24, the abscissa represents a superlattice wave vector and the ordinate represents energy. Magnitude of energy was found with a vertex of the valence band before consideration of influence by strain in a material forming the quantum dots being defined as a base point. As can be seen in FIGS. 23 and 24, it was found that, in the first superlattice semiconductor layer and the second superlattice semiconductor layer, the superlattice miniband was formed in the conduction band in the direction of stack of the quantum dot layer.

Magnitude of lower end energy and upper end energy of the conduction band first superlattice miniband of the first superlattice semiconductor layer was 0.989 eV and 1.040 eV and magnitude of lower end energy and upper end energy of the conduction band first superlattice miniband of the second superlattice semiconductor layer was 0.942 eV and 0.996 eV.

Namely, in Experimental Example 4, since the conduction band first superlattice minibands of the first superlattice semiconductor layer and the second superlattice semiconductor layer overlap in part with each other, carriers are relaxed fast. Since the second superlattice semiconductor layer has the type II structure, electrons and holes are spatially separated. Therefore, a lifetime of carriers is long and carrier recombination can be suppressed.

Figure 25:
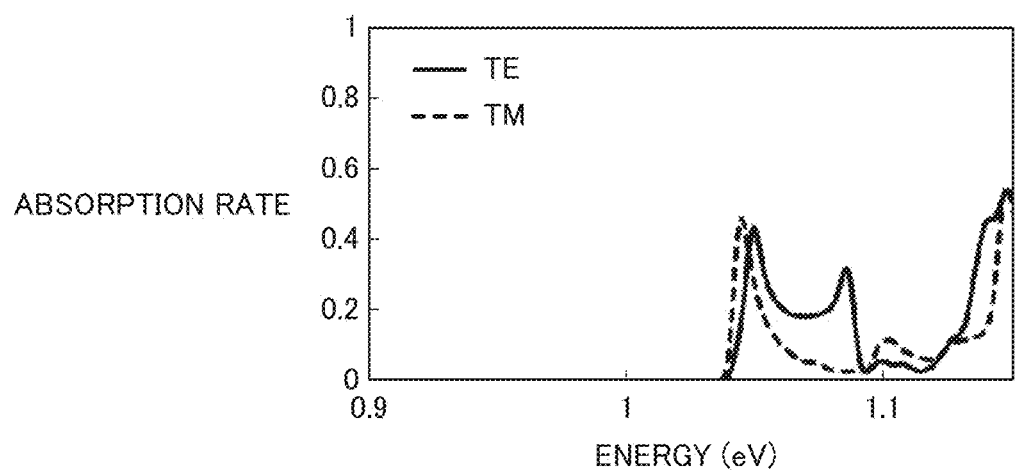
FIG. 25 is a graph showing results of calculation of optical absorption rate in transition from the valence band to the conduction band first superlattice miniband and the conduction band second or higher superlattice miniband calculated in Experimental Example 4.
Figure 26:
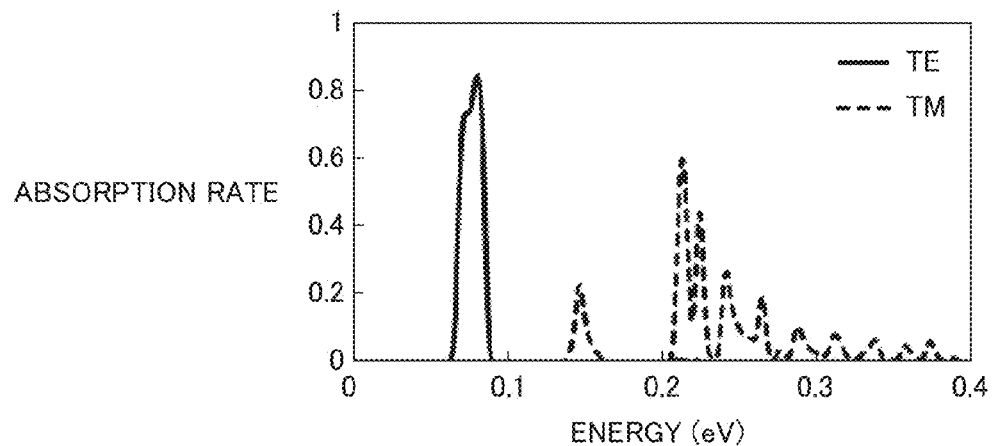
FIG. 26 is a graph showing results of calculation of optical absorption rate in transition from the conduction band first superlattice miniband to the conduction band second or higher superlattice miniband calculated in Experimental Example 4.

FIG. 25 shows results of calculation of optical absorption rate in transition from the valence band to the conduction band first superlattice miniband and the conduction band second or higher superlattice miniband, and FIG. 26 shows results of calculation of optical absorption rate in transition from the conduction band first superlattice miniband to the conduction band second or higher superlattice miniband.

In the present Experimental Example, carriers generated in the conduction band first superlattice miniband of the first superlattice semiconductor layer were all assumed to migrate to the conduction band first superlattice miniband of the second superlattice semiconductor layer. In calculation in connection with transition from the valence band to the conduction band first superlattice miniband and the conduction band second or higher superlattice miniband of the first superlattice semiconductor layer, it was assumed that the valence band was filled with carriers, and it was assumed that the conduction band first superlattice miniband and the conduction band second or higher superlattice miniband had no carriers (were empty) ($(f_i-f_f)=1$ in (Expression 1) above). In calculation in connection with transition from the conduction band first superlattice miniband of the second superlattice semiconductor layer to the conduction band second or higher superlattice miniband of the second superlattice semiconductor layer, it was assumed that the conduction band first superlattice miniband was filled with carriers, and it was assumed that the conduction band second or higher superlattice miniband had no carriers (was empty) ($(f_i-f_f)=1$ in (Expression 1) above). In FIGS. 25 and 26, the abscissa represents energy and the ordinate represents optical absorption rate. In Experimental Example 4, since carriers are subjected to second-step photoexcitation in the second superlattice semiconductor layer close to the n-type semiconductor layer, carriers are promptly extracted from the n-type semiconductor layer.

A radiative lifetime in the second superlattice semiconductor layer was calculated with the use of Expression 2, and it was 46 ns at superlattice wave number $K_z=0$, between the conduction band first superlattice miniband and the valence band first superlattice miniband.

COMPARATIVE EXPERIMENTAL EXAMPLE 4

In Comparative Experimental Example 4, it was assumed that the superlattice semiconductor layer was formed only from the superlattice structure of the type I structure in Experimental Example 4 above, and the miniband structure was calculated and a light absorption spectrum and a radiative lifetime were simulated. The entire superlattice semiconductor layer had a thickness of 6 µm.

Potential distribution before consideration of strain in the conduction band and the valence band (heavy holes and light holes) of the superlattice structure calculated in the present Comparative Experimental Example and miniband structures in the conduction band (superlattice minibands up to the 50th being illustrated) are as shown in FIGS. 21 and 23. Unlike Experimental Example 4 above, the superlattice semiconductor layer is formed only from the superlattice structure of the type I structure. Therefore, migration of carriers generated in the superlattice miniband is gentle over the entire superlattice semiconductor layer.

Figure 27:
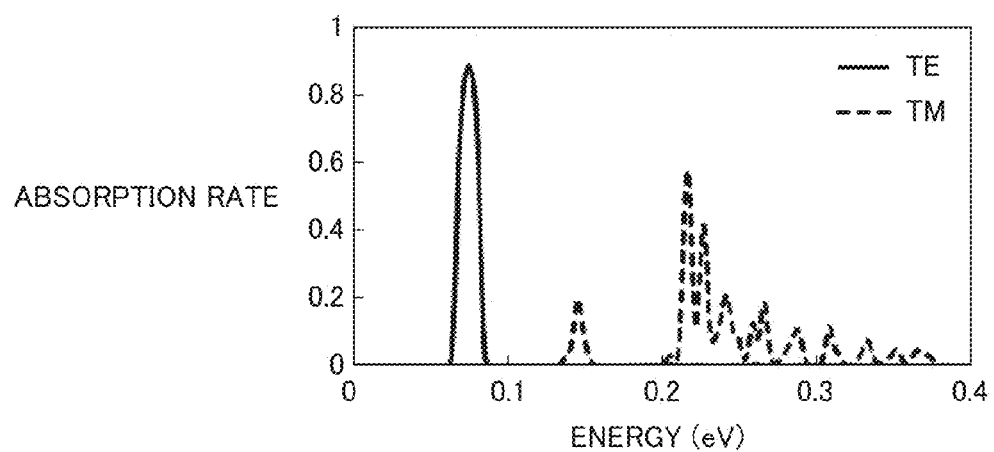
FIG. 27 is a graph showing results of calculation of optical absorption rate in transition from the conduction band first superlattice miniband to the conduction band second or higher superlattice miniband calculated in Comparative Experimental Example 4.

Optical absorption rate in transition from the valence band to the conduction band first superlattice miniband and the conduction band second or higher superlattice miniband and optical absorption rate in transition from the conduction band first superlattice miniband to the conduction band second or higher superlattice miniband were calculated. Here, $(f_i-f_f)$ in (Expression 1) above was assumed as 0.5. Therefore, based on relation with a film thickness of the superlattice structure which is an absorption layer, a result of the optical absorption rate in transition from the valence band to the conduction band first superlattice miniband and the conduction band second or higher superlattice miniband was the same as in FIG. 25. FIG. 27 shows optical absorption rate in transition from the conduction band first superlattice miniband to the conduction band second or higher superlattice miniband.

A radiative lifetime was calculated with the use of Expression 2, and it was 3 ns at superlattice wave number $K_z=0$, between the conduction band first superlattice miniband and the valence band first superlattice miniband.

<Discussion>

Light absorption in transition from the valence band to the conduction band first superlattice miniband and the conduction band second or higher superlattice miniband was the same between the superlattice semiconductor layer in Experimental Example 4 and the superlattice semiconductor layer in Comparative Experimental Example 4, and no noticeable difference in an absorption band or an absorption coefficient was observed in light absorption in transition from the conduction band first superlattice miniband to the conduction band second or higher superlattice miniband. On the other hand, Experimental Example 4 was approximately 15 times longer than Comparative Experimental Example 4 in a radiative lifetime between the conduction band first superlattice miniband and the valence band first superlattice miniband.

Therefore, since a lifetime of carriers in the superlattice miniband can be extended without substantial change in light absorption in the second step through the superlattice miniband, efficiency in two-step transition can be enhanced. Since the n-type semiconductor layer is arranged on the side of the second superlattice semiconductor layer, carriers subjected to the second-step photoexcitation in the second superlattice semiconductor layer are promptly extracted from the n-type semiconductor layer. From the foregoing, it was confirmed that carriers generated in the conduction band first superlattice miniband were efficiently extracted to the n-type semiconductor layer before recombination or relaxation. Therefore, the light receiving element including the superlattice semiconductor layer in Experimental Example 4 can achieve an improved short-circuit current.

EXAMPLE 2

The light receiving element in one embodiment of the present invention was subjected to simulation.

[Evaluation Method]

A miniband structure of the superlattice structure and a radiative lifetime were simulated by using the 8-band k·p Hamiltonian plane wave expansion method in consideration of influence by strain and a piezo electric field effect.

$$\frac{1}{\tau_{if}} = \frac{1}{3} \frac{\bar{n} e^2 (E_i - E_f)}{\pi \hbar^2 c^3 \varepsilon_0 m_0^2} (|\hat{e}_x \cdot p_{if}|^2 + |\hat{e}_y \cdot p_{if}|^2 + |\hat{e}_z \cdot p_{if}|^2) \quad \text{(Expression 3)}$$

In (Expression 3) above, $p_{if}$ represents a matrix element, $E_i - E_f$ represents magnitude of energy between transitions, i and f each represent a sub band number, $\bar{n}$ represents an index of refraction, c represents a velocity of light, $\varepsilon_0$ represents a vacuum dielectric constant, $m_0$ represents an electron mass, $\tau_{if}$ represents a radiative lifetime, e represents elementary charge, represents a value calculated by dividing a Planck constant h by twice of circular constant $\pi$, $\hat{e}_x$ represents a unit vector of x polarization, $\hat{e}_y$ represents a unit vector of y polarization, and $\hat{e}_z$ represents a unit vector of z polarization. A direction of polarization was defined as an x polarized wave (100) or a y polarized wave (101) which is in the in-plane direction of the quantum dot layer and as a z polarized wave (001) which is in the direction of stack of quantum dots.

EXPERIMENTAL EXAMPLE 2-1

In Experimental Example 2-1, band calculation of the superlattice semiconductor layer was carried out and a radiative lifetime was simulated. In the superlattice semiconductor layer, gallium arsenide antimony ($GaAs_{0.80}Sb_{0.20}$) was employed as a base semiconductor material forming the barrier layer and indium arsenide (InAs) was employed as a quantum dot material. Though $GaAs_xSb_{1-x}$ was employed as the base semiconductor material and $In_yGa_{1-y}As$ was employed as the quantum dot material in the present Example, values for x and y can be changed as appropriate and a different semiconductor material may be employed.

In the superlattice semiconductor layer, a quantum dot has a lens shape including a wetting layer of 0.5 nm, a diameter size in the in-plane direction of 20 nm, and a size (a height) in the direction of stack of 3 nm. A distance in the in-plane direction between the quantum dots was set to 20 nm and a distance in the direction of stack between the quantum dots was set to 3 nm Experimental Example 2-1 assumes a realistic quantum dot size obtained with a general fabrication method.

Figure 29:
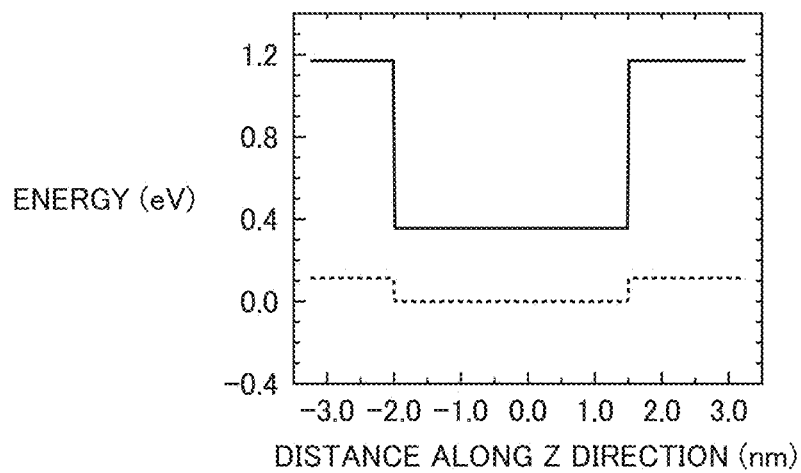
FIG. 29 is a diagram of potential distribution before consideration of strain in the conduction band and the valence band (heavy holes and light holes) of the superlattice semiconductor layer calculated in Experimental Example 2-1.

FIG. 29 shows potential distribution before consideration of strain in the conduction band and the valence band (heavy holes and light holes) of the superlattice semiconductor layer calculated in the present Example. The abscissa represents a distance in the direction of stack (the z direction in FIG. 28) of quantum dot centers and the ordinate represents energy. Magnitude of energy was found with a vertex of the valence band before consideration of influence by strain in a material forming the quantum dots being defined as a base point. The solid line represents potential distribution of the conduction band and the dashed line represents potential distribution of the valence band. As can be seen in FIG. 29, the superlattice structure of the superlattice semiconductor layer is the type II structure. Therefore, since electrons and holes are spatially separated, a lifetime of carriers is long and carrier recombination can be suppressed.

Figure 30:
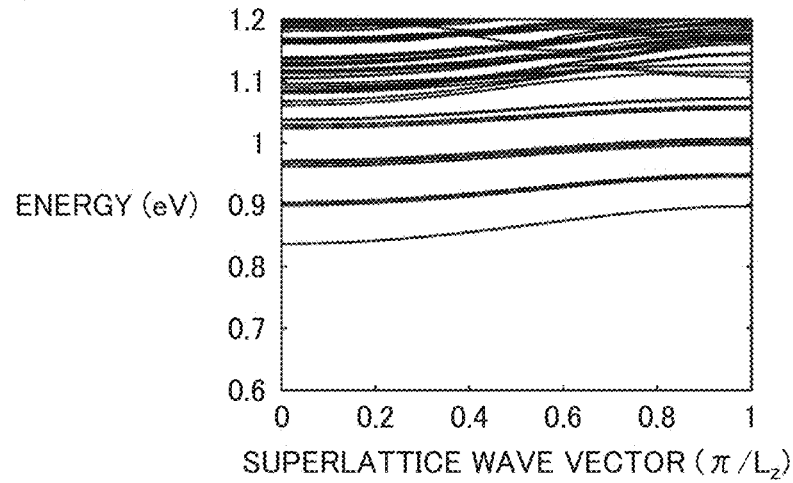
FIG. 30 is a diagram of a miniband structure in the conduction band of the superlattice semiconductor layer calculated in Experimental Example 2-1.

FIG. 30 shows miniband structures (superlattice minibands up to the 50th being illustrated) in the conduction band of the superlattice semiconductor layer calculated in Experimental Example 2-1. In FIG. 30, the abscissa represents a superlattice wave vector and the ordinate represents energy. Magnitude of energy was found with a vertex of the valence band before consideration of influence by strain in a material forming the quantum dots being defined as a base point. It can be seen in FIG. 30 that the superlattice miniband is formed in the conduction band in the direction of stack of the quantum dot layer in the superlattice semiconductor layer.

A radiative lifetime (at superlattice wave number Kz=0) between the conduction band first superlattice miniband and the valence band first superlattice miniband in the superlattice semiconductor layer was calculated with the use of Expression 3, and it was 31 ns.

COMPARATIVE EXPERIMENTAL EXAMPLE 2-1

In Comparative Experimental Example 2-1, the superlattice semiconductor layer was fabricated as in Experimental Example 2-1 except that the barrier layer in Experimental Example 2-1 was composed of gallium arsenide antimony ($GaAs_{0.85}Sb_{0.15}$), and band calculation of the superlattice semiconductor layer was carried out and a radiative lifetime was simulated.

Figure 31:
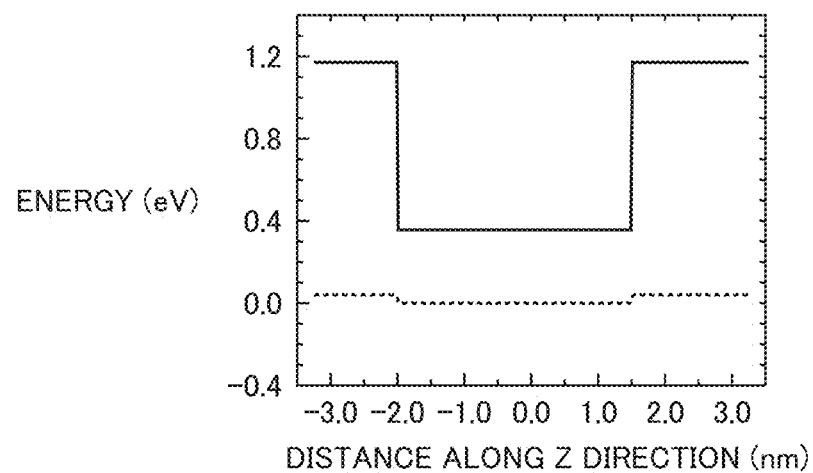
FIG. 31 is a diagram of potential distribution before consideration of strain in the conduction band and the valence band (heavy holes and light holes) of the superlattice semiconductor layer calculated in Comparative Experimental Example 2-1.

Potential distribution before consideration of strain in the conduction band and the valence band (heavy holes and light holes) of the superlattice structure calculated in Comparative Experimental Example 2-1 is as shown in FIG. 31. As can be seen in FIG. 31, the superlattice structure of the superlattice semiconductor layer is the type II structure.

A radiative lifetime (at superlattice wave number Kz=0) between the conduction band first superlattice miniband and the valence band first superlattice miniband in the superlattice semiconductor layer was calculated with the use of Expression 3, and it was 5 ns.

COMPARATIVE EXPERIMENTAL EXAMPLE 2-2

In Comparative Experimental Example 2-2, the superlattice semiconductor layer was fabricated as in Experimental Example 2-1 except that a distance in the direction of stack between the quantum dots in Experimental Example 2-1 was set to 5 nm, and band calculation of the superlattice semiconductor layer was carried out and a radiative lifetime was simulated.

The superlattice structure calculated in Comparative Experimental Example 2-2 is the type II structure as in Experimental Example 2-1.

A radiative lifetime (at superlattice wave number Kz=0) between the conduction band first superlattice miniband and the valence band first superlattice miniband in the superlattice semiconductor layer was calculated with the use of Expression 3, and it was 10 ns.

EXPERIMENTAL EXAMPLE 2-2

In Experimental Example 2-2, the superlattice semiconductor layer was fabricated as in Experimental Example 2-1 except that a diameter size in the in-plane direction of the quantum dot in Experimental Example 2-1 was set to 25 nm and a size (a height) in the direction of stack of the quantum dot was set to 3 nm, and band calculation of the superlattice semiconductor layer was carried out and a radiative lifetime was simulated. In addition to Experimental Example 2-1, Experimental Example 2-2 assumes a realistic quantum dot size obtained with a general fabrication method.

The superlattice structure of the superlattice semiconductor layer in Experimental Example 2-2 is the type II structure as in Experimental Example 2-1.

A radiative lifetime (at superlattice wave number Kz=0) between the conduction band first superlattice miniband and the valence band first superlattice miniband in the superlattice semiconductor layer was calculated with the use of Expression 3, and it was 49 ns.

EXPERIMENTAL EXAMPLE 2-3

In Experimental Example 2-3, the superlattice semiconductor layer was fabricated as in Experimental Example 2-1 except that a diameter size in the in-plane direction of the quantum dot in Experimental Example 2-1 was set to 20 nm and a size (a height) in the direction of stack of the quantum dot was set to 5 nm, and band calculation of the superlattice semiconductor layer was carried out and a radiative lifetime was simulated. In addition to Experimental Example 2-1 and Experimental Example 2-2, Experimental Example 2-3 assumes a realistic quantum dot size obtained with a general fabrication method.

The superlattice structure of the superlattice semiconductor layer in Experimental Example 2-3 is the type II structure as in Experimental Example 2-1.

A radiative lifetime (at superlattice wave number Kz=0) between the conduction band first superlattice miniband and the valence band first superlattice miniband in the superlattice semiconductor layer was calculated with the use of Expression 3, and it was 47 ns.

EXPERIMENTAL EXAMPLE 2-4

In Experimental Example 2-4, the superlattice semiconductor layer was fabricated as in Experimental Example 2-1 except that a distance in the direction of stack between the quantum dots in Experimental Example 2-1 was set to 2 nm, and band calculation of the superlattice semiconductor layer was carried out and a radiative lifetime was simulated.

The superlattice structure of the superlattice semiconductor layer in Experimental Example 2-4 is the type II structure as in Experimental Example 2-1.

A radiative lifetime (at superlattice wave number Kz=0) between the conduction band first superlattice miniband and the valence band first superlattice miniband in the superlattice semiconductor layer was calculated with the use of Expression 3, and it was 83 ns.

EXPERIMENTAL EXAMPLE 2-5

In Experimental Example 2-5, band calculation of the superlattice semiconductor layer was carried out and a radiative lifetime was simulated. In the superlattice semiconductor layer, gallium arsenide antimony ($GaAs_{0.85}Sb_{0.15}$) was employed as the base semiconductor material forming the barrier layer and indium arsenide (InAs) was employed as the quantum dot material.

In the superlattice semiconductor layer, a quantum dot had a lens shape including a wetting layer of 0.5 nm, a diameter size in the in-plane direction of 20 nm, and a size (a height) in the direction of stack of 3 nm. A distance in the in-plane direction between the quantum dots was set to 20 nm and a distance in the direction of stack between the quantum dots was set to 1 nm.

The superlattice structure of the superlattice semiconductor layer in Experimental Example 2-5 is the type II structure as in Comparative Experimental Example 2-1.

A radiative lifetime (at superlattice wave number Kz=0) between the conduction band first superlattice miniband and the valence band first superlattice miniband in the superlattice semiconductor layer was calculated with the use of Expression 3, and it was 33 ns.

EXPERIMENTAL EXAMPLE 2-6

In Experimental Example 2-6, the superlattice semiconductor layer was fabricated as in Experimental Example 2-4, except that the barrier layer in Experimental Example 2-4 was composed of gallium arsenide antimony ($GaAs_{0.70}Sb_{0.30}$), and band calculation of the superlattice semiconductor layer was carried out and a radiative lifetime was simulated.

Figure 32:
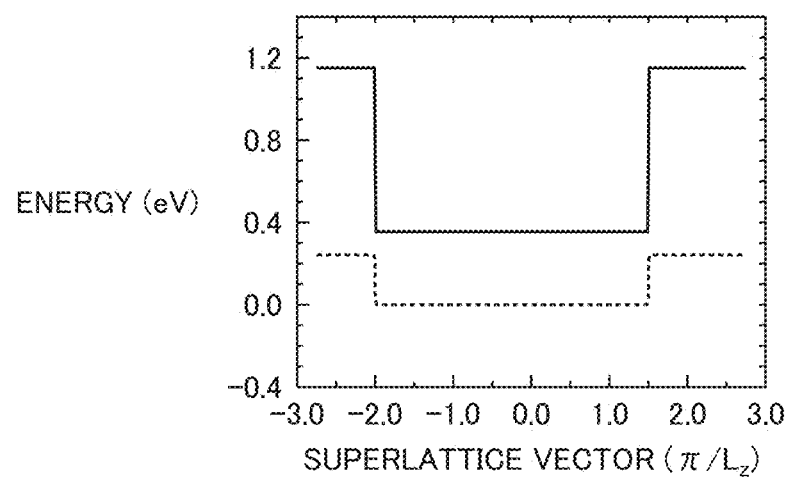
FIG. 32 is a diagram of potential distribution before consideration of strain in the conduction band and the valence band (heavy holes and light holes) of the superlattice semiconductor layer calculated in Experimental Example 2-6.

Potential distribution before consideration of strain in the conduction band and the valence band (heavy holes and light holes) of the superlattice structure calculated in Experimental Example 2-6 is as shown in FIG. 32. As can be seen in FIG. 32, the superlattice structure of the superlattice semiconductor layer is the type II structure.

A radiative lifetime (at superlattice wave number Kz=0) between the conduction band first superlattice miniband and the valence band first superlattice miniband in the superlattice semiconductor layer was calculated with the use of Expression 3, and it was 620 ns.

EXPERIMENTAL EXAMPLE 2-7

In Experimental Example 2-7, the superlattice semiconductor layer was fabricated as in Experimental Example 2-6 except that a distance in the direction of stack between the quantum dots in Experimental Example 2-6 was set to 4 nm, and band calculation of the superlattice semiconductor layer was carried out and a radiative lifetime was simulated.

The superlattice structure of the superlattice semiconductor layer in Experimental Example 2-7 is the type II structure as in Experimental Example 2-6.

A radiative lifetime (at superlattice wave number Kz=0) between the conduction band first superlattice miniband and the valence band first superlattice miniband in the superlattice semiconductor layer was calculated with the use of Expression 3, and it was 222 ns.

EXPERIMENTAL EXAMPLE 2-8

In Experimental Example 2-8, band calculation of the superlattice semiconductor layer was carried out and a radiative lifetime was simulated. In the superlattice semiconductor layer, gallium arsenide antimony ($GaAs_{0.75}Sb_{0.25}$) was employed as the base semiconductor material forming the barrier layer and indium arsenide (InAs) was employed as the quantum dot material.

In the superlattice semiconductor layer, a quantum dot had a lens shape including a wetting layer of 0.5 nm, a diameter size in the in-plane direction of 20 nm, and a size (a height) in the direction of stack of 3 nm. A distance in the in-plane direction between the quantum dots was set to 20 nm and a distance in the direction of stack between the quantum dots was set to 4 nm.

Figure 33:
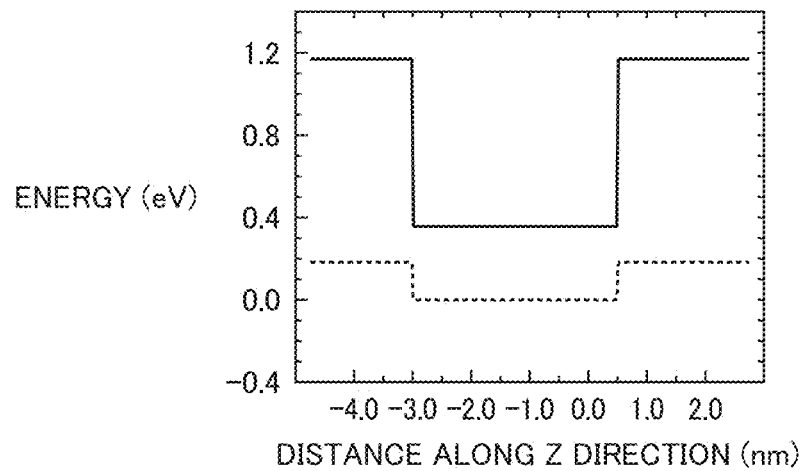
FIG. 33 is a diagram of potential distribution before consideration of strain in the conduction band and the valence band (heavy holes and light holes) of the superlattice semiconductor layer calculated in Experimental Example 2-8.

FIG. 33 shows potential distribution before consideration of strain in the conduction band and the valence band (heavy holes and light holes) of the superlattice semiconductor layer calculated in Experimental Example 2-8. As can be seen in FIG. 33, the superlattice structure of the superlattice semiconductor layer is the type II structure. Therefore, since electrons and holes are spatially separated, a lifetime of carriers is long and carrier recombination can be suppressed.

A radiative lifetime (at superlattice wave number $Kz=0$) between the conduction band first superlattice miniband and the valence band first superlattice miniband in the superlattice semiconductor layer was calculated with the use of Expression 3, and it was 22 ns.

EXPERIMENTAL EXAMPLE 2-9

In Experimental Example 2-9, the superlattice semiconductor layer was fabricated as in Experimental Example 2-8 except that a distance in the direction of stack between the quantum dots in Experimental Example 2-8 was set to 3 nm, and band calculation of the superlattice semiconductor layer was carried out and a radiative lifetime was simulated.

The superlattice structure of the superlattice semiconductor layer in Experimental Example 2-9 is the type II structure as in Experimental Example 2-8.

A radiative lifetime (at superlattice wave number $Kz=0$) between the conduction band first superlattice miniband and the valence band first superlattice miniband in the superlattice semiconductor layer was calculated with the use of Expression 3, and it was 146 ns.

COMPARATIVE EXPERIMENTAL EXAMPLE 2-3

In Comparative Experimental Example 2-3, the superlattice semiconductor layer was fabricated as in Experimental Example 2-8 except that a distance in the direction of stack between the quantum dots in Experimental Example 2-8 was set to 6 nm, and band calculation of the superlattice semiconductor layer was carried out and a radiative lifetime was simulated.

The superlattice structure calculated in Comparative Experimental Example 2-3 is the type II structure as in Experimental Example 2-8.

A radiative lifetime (at superlattice wave number $Kz=0$) between the conduction band first superlattice miniband and the valence band first superlattice miniband in the superlattice semiconductor layer was calculated with the use of Expression 3, and it was 14 ns.

EXPERIMENTAL EXAMPLE 2-10

In Experimental Example 2-10, band calculation of the superlattice semiconductor layer was carried out and a radiative lifetime was simulated. In the superlattice semiconductor layer, gallium arsenide antimony ($GaAs_{0.65}Sb_{0.35}$) was employed as the base semiconductor material forming the barrier layer and indium arsenide (InAs) was employed as the quantum dot material.

In the superlattice semiconductor layer, a quantum dot had a lens shape including a wetting layer of 0.5 nm, a diameter size in the in-plane direction of 20 nm, and a size (a height) in the direction of stack of 3 nm. A distance in the in-plane direction between the quantum dots was set to 20 nm and a distance in the direction of stack between the quantum dots was set to 5 nm.

Figure 34:
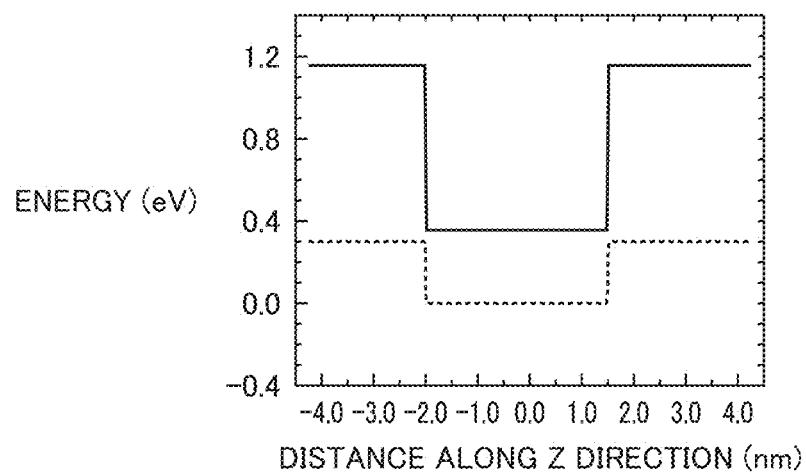
FIG. 34 is a diagram of potential distribution before consideration of strain in the conduction band and the valence band (heavy holes and light holes) of the superlattice semiconductor layer calculated in Experimental Example 2-10.

FIG. 34 shows potential distribution before consideration of strain in the conduction band and the valence band (heavy holes and light holes) of the superlattice semiconductor layer calculated in Experimental Example 2-10. As can be seen in FIG. 34, the superlattice structure of the superlattice semiconductor layer is the type II structure. Therefore, since electrons and holes are spatially separated, a lifetime of carriers is long and carrier recombination can be suppressed.

A radiative lifetime (at superlattice wave number $Kz=0$) between the conduction band first superlattice miniband and the valence band first superlattice miniband in the superlattice semiconductor layer was calculated with the use of Expression 3, and it was 290 ns.

EXPERIMENTAL EXAMPLE 2-11

In Experimental Example 2-11, the superlattice semiconductor layer was fabricated as in Experimental Example 2-9 except that the quantum dot material in Experimental Example 2-9 was composed of $In_{0.80}Ga_{0.20}As$, and band calculation of the superlattice semiconductor layer was carried out and a radiative lifetime was simulated.

Figure 35:
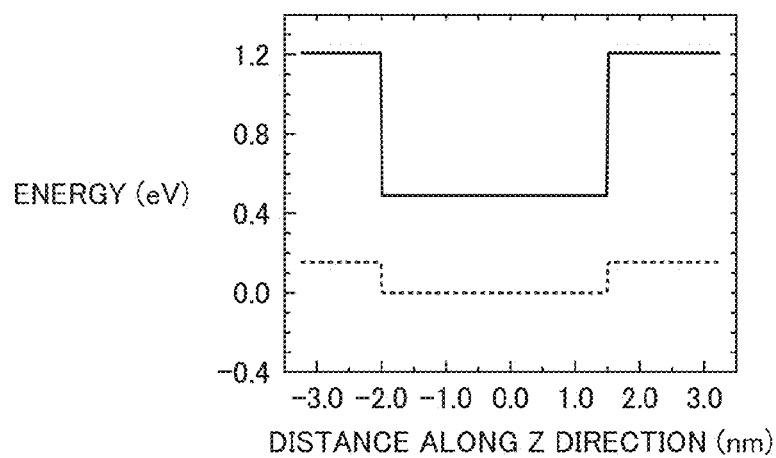
FIG. 35 is a diagram of potential distribution before consideration of strain in the conduction band and the valence band (heavy holes and light holes) of the superlattice semiconductor layer calculated in Experimental Example 2-11.

Potential distribution before consideration of strain in the conduction band and the valence band (heavy holes and light holes) of the superlattice structure calculated in Experimental Example 2-11 is as shown in FIG. 35. As can be seen in FIG. 35, the superlattice structure of the superlattice semiconductor layer is the type II structure.

A radiative lifetime (at superlattice wave number $Kz=0$) between the conduction band first superlattice miniband and the valence band first superlattice miniband in the superlattice semiconductor layer was calculated with the use of Expression 3, and it was 416 ns.

Table 1 summarizes results.

TABLE 1

| | | Quantum Dot | | | | | | | |
|---|---|---|---|---|---|---|---|---|---|
| | Barrier Layer | Material | Diameter in In-Plane Direction (nm) | Height in Direction of Stack (nm) | d: Distance in Direction of Stack Between Quantum Dots (nm) | q: Sb/ (Sb + As) | Right Side of Expression A: (3d + 10)/100 | Right Side of Expression B: (3d + 15)/100 | Radiative Lifetime (ns) |
| Experimental Example 2-1 | $GaAs_{0.80}Sb_{0.20}$ | InAs | 20 | 3 | 3 | 0.20 | 0.19 | 0.24 | 31 |
| Experimental Comparative Example 2-1 | $GaAs_{0.85}Sb_{0.15}$ | InAs | 20 | 3 | 3 | 0.15 | 0.19 | 0.24 | 5 |

TABLE 1-continued

| | | Quantum Dot | | | | | | | |
|---|---|---|---|---|---|---|---|---|---|
| | Barrier Layer | Material | Diameter in In-Plane Direction (nm) | Height in Direction of Stack (nm) | d: Distance in Direction of Stack Between Quantum Dots (nm) | q: Sb/ (Sb + As) | Right Side of Expression A: (3d + 10)/100 | Right Side of Expression B: (3d + 15)/100 | Radiative Lifetime (ns) |
| Experimental Comparative Example 2-2 | $GaAs_{0.80}Sb_{0.20}$ | InAs | 20 | 3 | 5 | 0.20 | 0.25 | 0.30 | 10 |
| Experimental Example 2-2 | $GaAs_{0.80}Sb_{0.20}$ | InAs | 25 | 3 | 3 | 0.20 | 0.19 | 0.24 | 49 |
| Experimental Example 2-3 | $GaAs_{0.80}Sb_{0.20}$ | InAs | 20 | 5 | 3 | 0.20 | 0.19 | 0.24 | 47 |
| Experimental Example 2-4 | $GaAs_{0.80}Sb_{0.20}$ | InAs | 20 | 3 | 2 | 0.20 | 0.16 | 0.21 | 83 |
| Experimental Example 2-5 | $GaAs_{0.85}Sb_{0.15}$ | InAs | 20 | 3 | 1 | 0.15 | 0.13 | 0.18 | 33 |
| Experimental Example 2-6 | $GaAs_{0.70}Sb_{0.30}$ | InAs | 20 | 3 | 2 | 0.30 | 0.16 | 0.21 | 620 |
| Experimental Example 2-7 | $GaAs_{0.70}Sb_{0.30}$ | InAs | 20 | 3 | 4 | 0.30 | 0.22 | 0.27 | 222 |
| Experimental Example 2-8 | $GaAs_{0.75}Sb_{0.25}$ | InAs | 20 | 3 | 4 | 0.25 | 0.22 | 0.27 | 22 |
| Experimental Example 2-9 | $GaAs_{0.75}Sb_{0.25}$ | InAs | 20 | 3 | 3 | 0.25 | 0.19 | 0.24 | 146 |
| Experimental Comparative Example 2-3 | $GaAs_{0.75}Sb_{0.25}$ | InAs | 20 | 3 | 6 | 0.25 | 0.28 | 0.33 | 14 |
| Experimental Example 2-10 | $GaAs_{0.65}Sb_{0.35}$ | InAs | 20 | 3 | 5 | 0.35 | 0.25 | 0.30 | 290 |
| Experimental Example 2-11 | $GaAs_{0.75}Sb_{0.25}$ | $In_{0.80}Ga_{0.20}As$ | 20 | 3 | 3 | 0.25 | 0.19 | 0.24 | 416 |

<Discussion>

In Experimental Example 2-1, since d (nm) representing a distance between the quantum dots in the direction of stack of the superlattice structure is set to 3, the right side of Expression A is calculated as 0.19. Since q which is a value representing a ratio Sb/(Sb+As) of the barrier layer is set to 0.20, Expression A is satisfied. When the quantum dot structure is the type I structure, a radiative lifetime is generally from 1 to 2 ns. Therefore, Experimental Example 2-1 in which a radiative lifetime of 31 ns is obtained achieves enhanced efficiency in extraction of carriers. In Comparative Experimental Example 2-1, q which is a value representing a ratio Sb/(Sb+As) of the barrier layer in Experimental Example 2-1 is set to 0.15. Thus, Expression A is not satisfied and a radiative lifetime is as short as 5 ns. In Comparative Experimental Example 2-2 as well, d (nm) representing a distance between the quantum dots in the direction of stack of the superlattice structure in Experimental Example 2-1 is set to 5 and the right side of Expression A is calculated as 0.25. Therefore, Expression A is not satisfied and a radiative lifetime is as short as 10 ns.

In Experimental Example 2-2 and Experimental Example 2-3, in addition to Experimental Example 2-1, a quantum dot size is changed as a realistic quantum dot obtained with the general fabrication method, however, as in Experimental Example 2-1, Expression A is satisfied and radiative lifetimes are 49 ns and 47 ns in respective Experimental Examples. Therefore, it can be seen that the effect of the present invention is exhibited and efficiency in extraction of carriers is enhanced.

In Experimental Example 2-4, d (nm) representing a distance between the quantum dots in the direction of stack of the superlattice structure in Experimental Example 2-1 is set to 2 and the right side of Expression A is calculated as 0.16. Therefore, Expression A is sufficiently satisfied. A radiative lifetime of 83 ns is obtained and efficiency in extraction of carriers is further enhanced.

In Experimental Example 2-5, d (nm) representing a distance between the quantum dots in the direction of stack of the superlattice structure is set to 1 and the right side of Expression A is calculated as 0.13, and q which is a value representing a ratio Sb/(Sb+As) of the barrier layer is set to 0.15. Therefore, Expression A is satisfied. In Experimental Example 2-5 where a radiative lifetime of 33 ns is obtained, efficiency in extraction of carriers is enhanced. A case that d (nm) representing a distance between the quantum dots in the direction of stack of the superlattice structure is set to 3 in this Experimental Example 2-5 is the same as Comparative Experimental Example 2-1. Then, Expression A is not satisfied and a radiative lifetime is as short as 5 ns.

In Experimental Example 2-6, q which is a value representing a ratio Sb/(Sb+As) of the bather layer in Experimental Example 2-4 is increased to 0.30, and Expression A is sufficiently satisfied. Furthermore, in this case, since the right side of Expression B is calculated as 0.21, Expression B is sufficiently satisfied. A radiative lifetime of 620 ns is obtained and efficiency in extraction of carriers is further enhanced.

In Experimental Example 2-7, d (nm) representing a distance between the quantum dots in the direction of stack of the superlattice structure in Experimental Example 2-6 is doubled to 4 and the right side of Expression A is calculated as 0.22. Therefore, Expression A is sufficiently satisfied. Furthermore, in this case, since the right side of Expression B is calculated as 0.27, Expression B is satisfied. A radiative lifetime of 222 ns is obtained and efficiency in extraction of carriers is further enhanced.

In Experimental Example 2-8, d (nm) representing a distance between the quantum dots in the direction of stack of the superlattice structure is set to 4 and hence the right side of Expression A is calculated as 0.22. Since q which is a value representing a ratio Sb/(Sb+As) of the barrier layer is set to 0.25, Expression A is satisfied. Experimental Example 2-8 where a radiative lifetime of 22 ns is obtained achieves enhanced efficiency in extraction of carriers.

In Experimental Example 2-9, d (nm) representing a distance between the quantum dots in the direction of stack of the superlattice structure in Experimental Example 2-8 is set to 3 and the right side of Expression A is calculated as 0.19. Therefore, Expression A is sufficiently satisfied. Furthermore, in this case, since the right side of Expression B is calculated as 0.24, Expression B is satisfied. A radiative lifetime of 146 ns is obtained and efficiency in extraction of carriers is further enhanced. In Comparative Experimental Example 2-3, however, d (nm) representing a distance between the quantum dots in the direction of stack of the superlattice structure in Experimental Example 2-9 is set to 6, and the right side of Expression A is calculated as 0.28. Therefore, Expression A is not satisfied and a radiative lifetime is as short as 14 ns.

In Experimental Example 2-10, since d (nm) representing a distance between the quantum dots in the direction of stack of the superlattice structure is set to 5, the right side of Expression A is calculated as 0.25. Since q representing a ratio Sb/(Sb+As) of the barrier layer is set to 0.35, Expression A is sufficiently satisfied. Furthermore, in this case, since the right side of Expression B is calculated as 0.30, Expression B is satisfied. A radiative lifetime of 290 ns is obtained and efficiency in extraction of carriers is further enhanced.

In Experimental Example 2-11, the distance between the quantum dots in the direction of stack of the superlattice structure and the ratio Sb/(Sb+As) of the barrier layer are the same as in Experimental Example 2-9. Therefore, Expression A is satisfied. Even when the quantum dot material is changed to $In_{0.80}Ga_{0.20}As$, the effect of the present invention is exhibited and efficiency in extraction of carriers is enhanced. The present invention shows that a further effect is exhibited as y in $In_yGa_{1-y}As$ employed as a quantum dot material is smaller.

Figure 36:
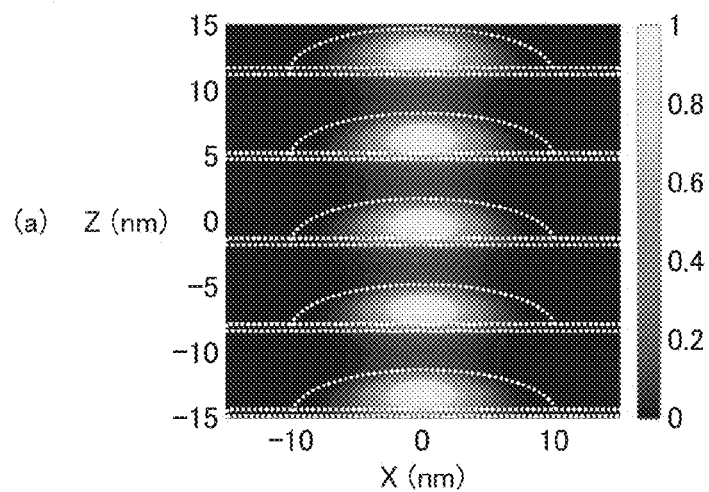
FIG. 36 is (a) a diagram of charge density distribution in a direction of stack of quantum dot centers at a superlattice wave number Kz=0 of the conduction band first superlattice miniband calculated in Experimental Example 2-9 and (b) a diagram of charge density distribution in the direction of stack of the quantum dot centers at superlattice wave number Kz=0 of a valence band first superlattice miniband calculated in Experimental Example 2-9.
Figure 36:
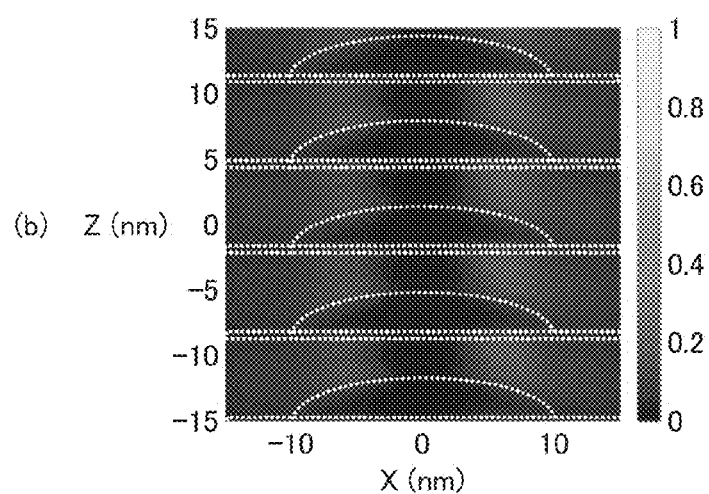

FIGS. 36 (a) and (b) shows charge density distribution (a square of a wave function) in the direction of stack of quantum dot centers at superlattice wave number Kz=0 of the conduction band first superlattice miniband and the valence band first superlattice miniband in Experimental Example 2-9, respectively. The abscissa indicates the x direction and the ordinate indicates the z direction, and a white dotted line indicates a region of quantum dots and a wetting layer.

In FIG. 36 (b), charge density distribution of the valence band first superlattice miniband is present in a barrier layer region distant from a line connecting the quantum dot centers. Therefore, overlap between the valence band first superlattice miniband shown in FIG. 36 (b) and the conduction band first superlattice miniband present in the quantum dot region shown in FIG. 36 (a) is extremely small. Therefore, a radiative lifetime is significantly extended. In Experimental Examples 2-1 to 2-8 and Experimental Examples 2-10 to 2-11, charge density distribution similar to that in FIG. 36 is shown.

Figure 37:
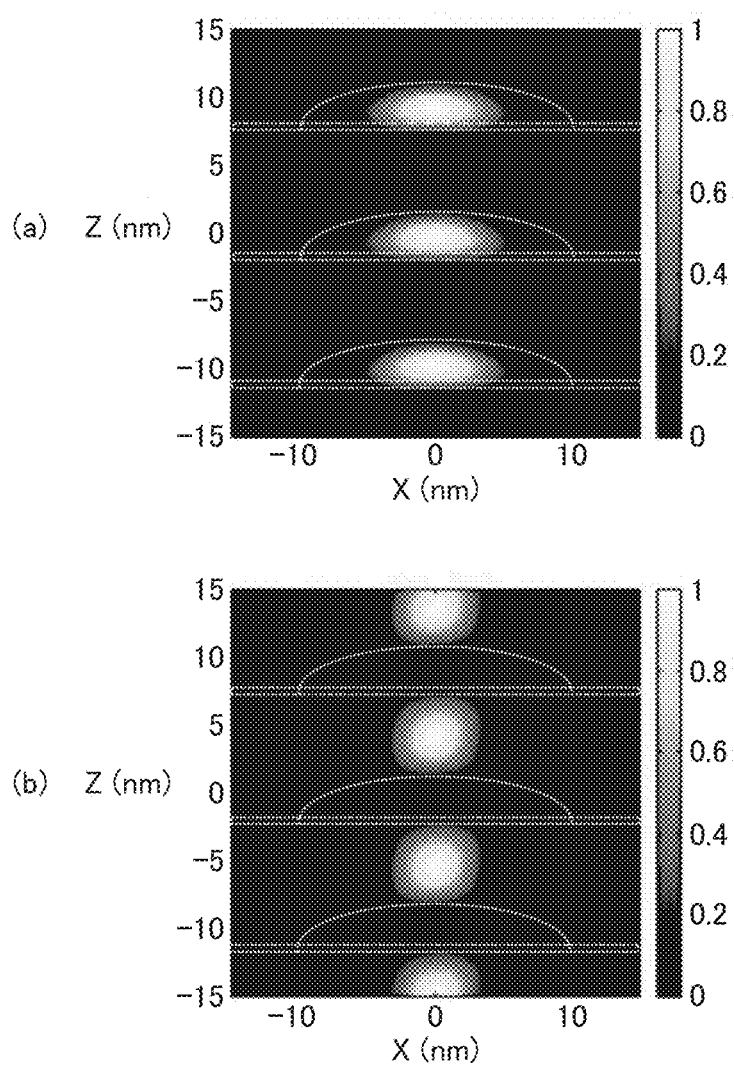
FIG. 37 is (a) a diagram of charge density distribution in a direction of stack of quantum dot centers at superlattice wave number Kz=0 of the conduction band first superlattice miniband calculated in Comparative Experimental Example 2-3 and (b) a diagram of charge density distribution in the direction of stack of the quantum dot centers at superlattice wave number Kz=0 of a valence band first superlattice miniband calculated in Comparative Experimental Example 2-3.

FIGS. 37 (a) and (b) shows charge density distribution (a square of a wave function) in the direction of stack of quantum dot centers at superlattice wave number Kz=0 of the conduction band first superlattice miniband and the valence band first superlattice miniband in Comparative Experimental Example 2-3, respectively. The abscissa indicates the x direction and the ordinate indicates the z direction, and a white dotted line indicates a region of quantum dots and a wetting layer.

In FIG. 37 (b), charge density distribution of the valence band first superlattice miniband is present in a barrier layer region around a line connecting the quantum dot centers. Therefore, overlap between the valence band first superlattice miniband shown in FIG. 37 (b) and the conduction band first superlattice miniband present in the quantum dot region shown in FIG. 37 (a) is greater than overlap between FIG. 36 (a) and FIG. 36 (b) and a radiative lifetime is shorter than in FIG. 36 (a) and FIG. 36 (b). In Comparative Experimental Examples 2-1 and 2-2, charge density distribution similar to that in FIG. 37 is shown.

In a light receiving element (such as a solar cell), light absorption and recombination conflict with each other. In general, recombination can be lessened by having the type II structure rather than the type I structure, however, light absorption is lessened. For example, in a solar cell making use of two-step photoexcitation through a conduction band superlattice miniband, light absorption from a valence band to a conduction band first superlattice miniband is sufficiently greater than light absorption from the conduction band first superlattice miniband to a conduction band second or higher superlattice miniband. Therefore, a radiative lifetime is desirably extended so long as an amount of light absorption from the valence band to the conduction band first superlattice miniband is not smaller than an amount of light absorption from the conduction band first superlattice miniband to the conduction band second or higher superlattice miniband.

In Experimental Example 2-1, an amount of a current generated as a result of light absorption from the valence band to the conduction band first superlattice miniband and an amount of a current generated as a result of light absorption from the conduction band first superlattice miniband to the conduction band second or higher superlattice miniband can roughly be estimated and compared with each other. Specifically, a light absorption coefficient can be calculated from (Expression 4) below and optical absorption rate can roughly be estimated from a film thickness of the superlattice semiconductor layer serving as a light absorption layer. Based on density of states of the conduction band and the valence band, a range of light absorption from the valence band to the conduction band first superlattice miniband and a range of light absorption from the conduction band first superlattice miniband to the conduction band second or higher superlattice miniband can be set. Density of energy flow of solar rays can be calculated from the Planck radiation formula (with a temperature of the surface of the sun being defined as 5800K) and an amount of a current in each range of light absorption can roughly be estimated from a product of optical absorption rate and density of energy flow of the solar rays.

Light absorption coefficient α can be estimated by solving (Expression 4) below.

$$\alpha(\omega) = \frac{e^2}{2\bar{n}c \, \epsilon_0 \, m_0^2 \omega L_x L_y} \int dK_z \sum_{i,f} |e \cdot p_{if}|^2 (f_i - f_f) G \quad \text{(Expression 4)}$$

In (Expression 4) above, $p_{if}$ represents a matrix element, i and f each represent a sub band number, $\bar{n}$ represents an index of refraction, c represents a velocity of light, $\epsilon_0$ represents a vacuum dielectric constant, $m_0$ represents an electron mass, $L_x$ and $L_y$ represent unit cell sizes in an x direction (a (100) direction) and a y direction (a (010) direction), respectively, $K_z$ represents a superlattice wave number, $f_i$ and $f_f$ each represent a distribution function, G represents Gaussian broadening (half-width=5 meV) owing to size variation and composition variation, ω represents an optical frequency, and e represents elementary charge. With regard to light absorption, 100 polarization and 010 polarization which are in the in-plane directions of the quantum dot layer and 001 polarization which is in the direction of stack of the quantum dot layer were considered.

The superlattice semiconductor layer in Experimental Example 2-1 was assumed to have a film thickness of 4 μm and occupation probability of 0.5, a range of light absorption from the valence band to the conduction band first superlattice miniband was defined as 0.50 eV to 0.89 eV and a range of light absorption from the conduction band first superlattice miniband to the conduction band second or higher superlattice miniband was defined as 0.00 eV to 0.50 eV, and a ratio of polarization of light absorption was assumed as 100 polarization:010 polarization:001 polarization=1:1:1. Then, a value of (an amount of a current from the valence band to the conduction band first superlattice miniband)/(an amount of a current from the conduction band first superlattice miniband to the conduction band second or higher superlattice miniband) was calculated as approximately 5, and it can be seen that light absorption from the valence band to the conduction band first superlattice miniband is sufficiently great. Therefore, the solar cell in Experimental Example 2-1 can have a significantly long radiative lifetime while an amount of light absorption from the valence band to the conduction band superlattice miniband is sufficiently kept, and a device excellent in efficiency in extraction of carriers can be provided.

With regard to the superlattice semiconductor layer having a radiative lifetime of 620 ns in Experimental Example 2-6 as well, an amount of a current was roughly estimated and compared similarly. The superlattice semiconductor layer in Experimental Example 2-6 was assumed to have a film thickness of 4 μm and occupation probability of 0.5, a range of light absorption from the valence band to the conduction band first superlattice miniband was defined as 0.50 eV to 0.76 eV and a range of light absorption from the conduction band first superlattice miniband to the conduction band second or higher superlattice miniband was defined as 0.00 eV to 0.50 eV, and a ratio of polarization of light absorption was assumed as 100 polarization:010 polarization:001 polarization=1:1:1. Then, a value of (an amount of a current from the valence band to the conduction band first superlattice miniband)/(an amount of a current from the conduction band first superlattice miniband to the conduction band second or higher superlattice miniband) was calculated as approximately 3 and it can be seen that light absorption from the valence band to the conduction band first superlattice miniband is sufficiently great. Therefore, with the solar cell in Experimental Example 2-6 as well which has a significantly long radiative lifetime while an amount of light absorption from the valence band to the conduction band superlattice miniband is sufficiently kept, a device excellent in efficiency in extraction of carriers can be provided.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

Industrial Applicability

The light receiving element according to the present invention can be employed for a solar cell, a photodiode, a semiconductor optical amplifier, and a quantum dot infrared sensor.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light receiving element, comprising:
a p-type semiconductor layer;
an n-type semiconductor layer; and
a first superlattice semiconductor layer and a second superlattice semiconductor layer arranged between said p-type semiconductor layer and said n-type semiconductor layer,
said first superlattice semiconductor layer and said second superlattice semiconductor layer each having a superlattice structure in which a barrier layer and a quantum dot layer containing quantum dots are alternately and repeatedly stacked,
a band structure of the superlattice structure of said first superlattice semiconductor layer being a type I structure,
a band structure of the superlattice structure of said second superlattice semiconductor layer being a type II structure,
the superlattice structure of said first superlattice semiconductor layer and the superlattice structure of said second superlattice semiconductor layer each forming a superlattice miniband owing to a conduction band quantum level of said quantum dot layer forming said superlattice structure, and
a conduction band first superlattice miniband of the superlattice structure of said second superlattice semiconductor layer being lower in lower end energy than a conduction band first superlattice miniband of the superlattice structure of said first superlattice semiconductor layer.

2. The light receiving element according to claim 1, wherein
said second superlattice semiconductor layer is arranged on a side of said n-type semiconductor layer.

3. The light receiving element according to claim 1, wherein
the superlattice miniband formed in the superlattice structure of said first superlattice semiconductor layer overlaps at least in part with the superlattice miniband formed in the superlattice structure of said second superlattice semiconductor layer, or
magnitude of energy gap between the superlattice miniband formed in the superlattice structure of said first superlattice semiconductor layer and the superlattice miniband formed in the superlattice structure of said second superlattice semiconductor layer is equal to or smaller than a total sum of LO phonon energy of a material for the barrier layer of said first superlattice semiconductor layer and thermal energy kT (k representing a Boltzmann constant and T representing an absolute temperature) at room temperature.

4. The light receiving element according to claim 1, wherein
said first superlattice semiconductor layer is composed of Ga, In, and As, and
said second superlattice semiconductor layer is composed of Ga, In, As, and Sb.

5. The light receiving element according to claim 4, further comprising a substrate composed of GaAs, wherein
said p-type semiconductor layer, said first superlattice semiconductor layer, said second superlattice semiconductor layer, and said n-type semiconductor layer are stacked in this order on said substrate.

6. A solar cell, comprising the light receiving element according to claim 1.

7. A light receiving element, comprising:
a superlattice semiconductor layer having a superlattice structure in which a barrier layer and a quantum dot layer containing quantum dots are alternately and repeatedly stacked,
said barrier layer containing at least any of Ga and Al, As, and Sb,
said quantum dot layer containing In and As, and
a value q represented by a composition ratio of said barrier layer Sb/(Sb+As) and a distance d (nm) between said quantum dots in a direction of stack of said superlattice semiconductor layer satisfy relation of $q \geq (3d+10)/100$.

8. The light receiving element according to claim 7, wherein
the value q represented by the composition ratio of said barrier layer Sb/(Sb+As) and the distance d (nm) between said quantum dots in the direction of stack of said superlattice semiconductor layer satisfy relation of $q \geq (3d+15)/100$.

9. The light receiving element according to claim 7, further comprising a p-type semiconductor layer and an n-type semiconductor layer, and said superlattice structure lying between said p-type semiconductor layer and said n-type semiconductor layer.

10. A solar cell, comprising the light receiving element according to claim 7.

* * * * *